United States Patent
Lee et al.

(10) Patent No.: US 12,532,732 B2
(45) Date of Patent: Jan. 20, 2026

(54) SEMICONDUCTOR DEVICE

(71) Applicant: SAMSUNG ELECTRONICS CO., LTD., Suwon-si (KR)

(72) Inventors: Bo Ram Lee, Suwon-si (KR); Ki-Il Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 381 days.

(21) Appl. No.: 18/219,140

(22) Filed: Jul. 7, 2023

(65) Prior Publication Data
US 2024/0120278 A1    Apr. 11, 2024

(30) Foreign Application Priority Data

Oct. 11, 2022 (KR) .................. 10-2022-0129805
Feb. 23, 2023 (KR) .................. 10-2023-0024004

(51) Int. Cl.
| | |
|---|---|
| H01L 23/528 | (2006.01) |
| H01L 23/522 | (2006.01) |
| H01L 29/06 | (2006.01) |
| H01L 29/417 | (2006.01) |
| H01L 29/423 | (2006.01) |
| H01L 29/775 | (2006.01) |
| H10D 30/43 | (2025.01) |
| H10D 30/67 | (2025.01) |

(Continued)

(52) U.S. Cl.
CPC ...... *H01L 23/5286* (2013.01); *H01L 23/5226* (2013.01); *H10D 30/43* (2025.01); *H10D 30/6735* (2025.01); *H10D 62/121* (2025.01); *H10D 64/251* (2025.01)

(58) Field of Classification Search
CPC ............ H01L 23/5286; H01L 23/5226; H01L 23/5283; H01L 23/535; H10D 30/43; H10D 30/6735; H10D 62/121; H10D 64/251; H10D 30/6757
USPC ........................................... 257/401
See application file for complete search history.

(56) References Cited

U.S. PATENT DOCUMENTS

| | | | |
|---|---|---|---|
| 10,685,865 B2 | 6/2020 | Sung et al. | |
| 11,335,597 B2 | 5/2022 | Litta et al. | |
| 11,393,819 B2 | 7/2022 | Li et al. | |

(Continued)

FOREIGN PATENT DOCUMENTS

| | | |
|---|---|---|
| KR | 10-2021-0122659 | 10/2021 |
| KR | 10-2021-0154689 | 12/2021 |

*Primary Examiner* — Tong-Ho Kim
(74) *Attorney, Agent, or Firm* — MORGAN, LEWIS & BOCKIUS LLP

(57) ABSTRACT

A semiconductor device includes: a substrate including an upper surface and a lower surface opposite to the upper surface; an active pattern disposed on the upper surface of the substrate and extending in a first direction; a field insulating film disposed on the upper surface of the substrate and covering a sidewall of the active pattern; a power rail disposed on the lower surface of the substrate and extending in the first direction; a trench formed in the substrate and exposing a portion of the power rail; and a metal pattern filling at least a portion of the trench and connected to the power rail, wherein a bottom surface of the trench is substantially coplanar with the lower surface of the substrate, wherein a sidewall of the trench has a convex shape, and wherein at least a portion of the field insulating film is disposed in the trench.

20 Claims, 29 Drawing Sheets

(51) Int. Cl.
*H10D 62/10* (2025.01)
*H10D 64/23* (2025.01)

(56) References Cited

U.S. PATENT DOCUMENTS

2021/0305130 A1\* 9/2021 Cho .................. H01L 21/76898
2021/0343578 A1 11/2021 Chang et al.
2022/0157723 A1 5/2022 Park et al.

\* cited by examiner

SEMICONDUCTOR DEVICE

CROSS-REFERENCE TO RELATED APPLICATION

This application claims priority under 35 USC § 119 to Korean Patent Application No. 10-2022-0129805 filed on Oct. 11, 2022, and Korean Patent Application No. 10-2023-0024004 filed on Feb. 23, 2023 in the Korean Intellectual Property Office, the disclosures of which are incorporated by reference herein in their entireties.

TECHNICAL FIELD

The present inventive concept relates to a semiconductor device.

DISCUSSION OF THE RELATED ART

A scaling scheme for increasing an integration density of a semiconductor device proposes, generally, a multi-gate transistor in which a multi-channel active pattern (or a silicon body) in a shape of a fin or a nanowire is formed on a substrate, and a gate is formed on the multi-channel active pattern.

Because such a multi-gate transistor uses a three-dimensional channel, the transistor may be easy to scale the same. Further, current control capability of the multi-gate transistor may be increased without increasing a gate length of the multi-gate transistor. In addition, the multi-gate transistor may effectively suppress SCE (short channel effect) in which potential of a channel area is affected by drain voltage.

As a pitch size of the semiconductor device decreases, research is currently being conducted to reduce capacitance between contacts and to secure electrical stability in the semiconductor device.

SUMMARY

According to an embodiment of the present inventive concept, a semiconductor device includes: a substrate including an upper surface and a lower surface opposite to the upper surface; an active pattern disposed on the upper surface of the substrate and extending in a first direction; a field insulating film disposed on the upper surface of the substrate and covering a sidewall of the active pattern; a power rail disposed on the lower surface of the substrate and extending in the first direction; a trench formed in the substrate and exposing a portion of the power rail; and a metal pattern filling at least a portion of the trench and connected to the power rail, wherein a bottom surface of the trench is substantially coplanar with the lower surface of the substrate, wherein a sidewall of the trench has a convex shape, and wherein at least a portion of the field insulating film is disposed in the trench.

According to an embodiment of the present inventive concept, a semiconductor device includes: a substrate including an upper surface and a lower surface opposite to the upper surface; an active pattern disposed on the upper surface of the substrate and extending in a first direction; a gate electrode covering at least a portion of the active pattern and extending in a second direction interesting the first direction; a power rail disposed on the lower surface of the substrate and extending in the first direction; a metal pattern disposed in the substrate and connected to the power rail; and a power rail via disposed on the metal pattern and disposed on one side of the gate electrode, wherein the power rail via is connected to the power rail via the metal pattern, wherein a bottom surface of the metal pattern extends in a parallel to the lower surface of the substrate and is substantially coplanar with the lower surface of the substrate, and wherein the metal pattern has a portion, wherein each of a width in the second direction of the portion of the metal pattern and a width in the first direction of the portion of the metal pattern gradually increases as the portion of the metal pattern extends in a direction from the lower surface of the substrate to the upper surface of the substrate.

According to an embodiment of the present inventive concept, a semiconductor device includes: a substrate including an upper surface and a lower surface opposite to the upper surface; an active pattern disposed on the upper surface of the substrate and extending in a first direction; a gate electrode covering at least a portion of the active pattern and extending in a second direction intersecting the first direction; a field insulating film disposed on the upper surface of the substrate and covering a sidewall of the active pattern; a power rail disposed on the lower surface of the substrate and extending in the first direction; a trench formed in the substrate and exposing a portion of the power rail, wherein the trench has a convexly shaped sidewall; a metal pattern filling at least a portion of the trench and connected to the power rail; a source/drain pattern disposed on the active pattern and on one side of the gate electrode; a source/drain contact disposed on the source/drain pattern; and a power rail via disposed on the metal pattern and disposed on one side of the gate electrode, wherein the power rail via is connected to the power rail via the metal pattern, wherein a bottom surface of the trench is substantially coplanar with the lower surface of the substrate, wherein at least a portion of the field insulating film is disposed in the trench, and wherein each of a width in the first direction of the trench and a width in the second direction of the trench gradually increases and then decreases as the trench extends in a direction from the lower surface of the substrate to the upper surface of the substrate.

BRIEF DESCRIPTION OF DRAWINGS

The above and features of the present inventive concept will become more apparent by describing in detail embodiments thereof with reference to the attached drawings, in which.

DETAILED DESCRIPTION OF EMBODIMENTS

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the spirit and scope of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, in the example, terms "below" and "beneath" may encompass both an orientation of above, below and beneath. The device may be otherwise oriented (e.g., rotated 90 degrees or at other orientations) and the spatially relative descriptors used herein may be interpreted accordingly.

In a diagram of a semiconductor device according to some embodiments of the present inventive concept, a fin-type transistor (FinFET) including a fin-type pattern-shaped channel area, a transistor including nanowires or nanosheets, MBCFE™ (Multi-Bridge Channel Field Effect Transistor) or a vertical transistor (Vertical FET) is shown illustratively. However, the present inventive concept is not limited thereto. In another example, a semiconductor device according to some embodiments of the present inventive concept may include a tunneling transistor (tunneling FET) or a three-dimensional (3D) transistor. In still another example, a semiconductor device according to some embodiments of the present inventive concept may include a planar transistor. In addition, the present inventive concept may be applied to a 2D (two-dimensional) material transistor (2D material-based FETs) and a heterostructure thereof.

Further, a semiconductor device according to some embodiments of the present inventive concept may include a bipolar junction transistor, a lateral double diffusion transistor (LDMOS), and the like.

Hereinafter, embodiments of the present inventive concept according to the present inventive concept will be described with reference to the accompanying drawings.

First, referring to FIG. 1 to FIG. 4, a semiconductor device according to some embodiments is described.

Figure 1:
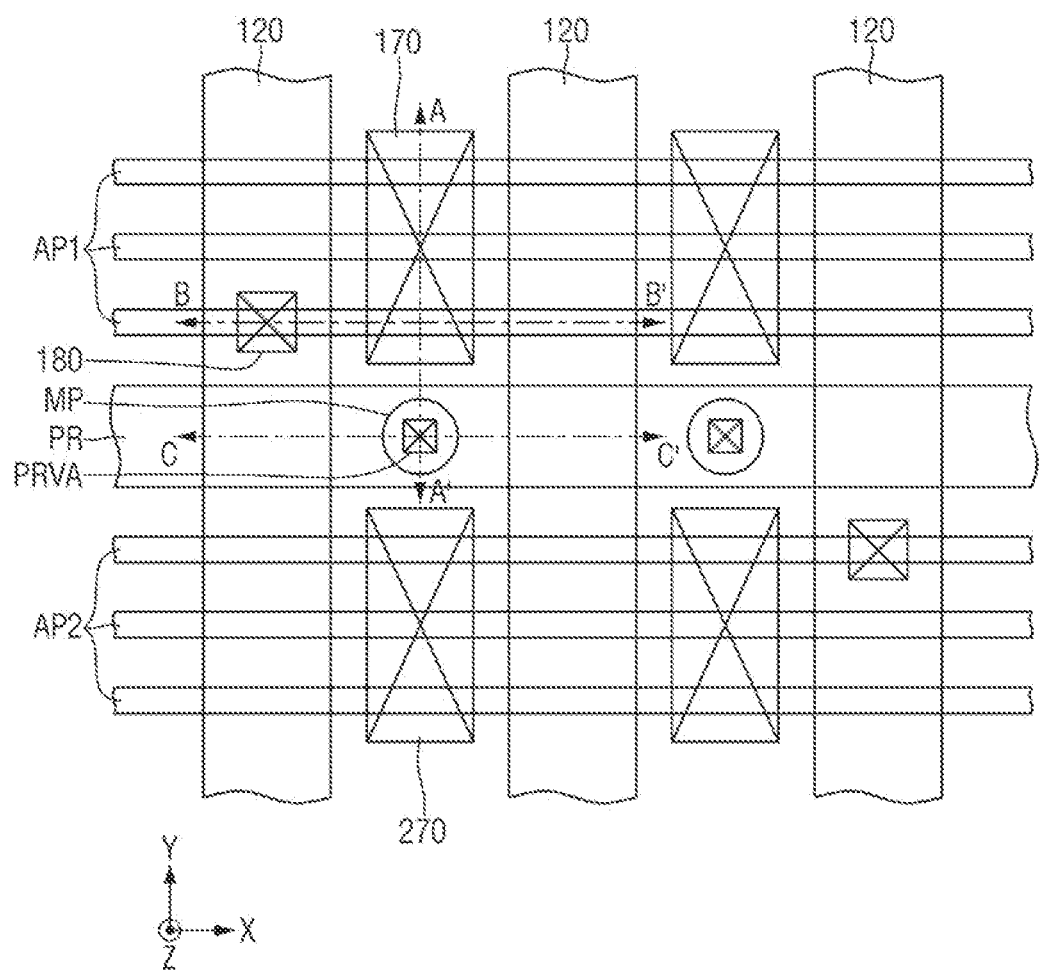
FIG. 1 is an illustrative layout diagram for illustrating a semiconductor device according to an embodiment of the present inventive concept.
Figure 2:
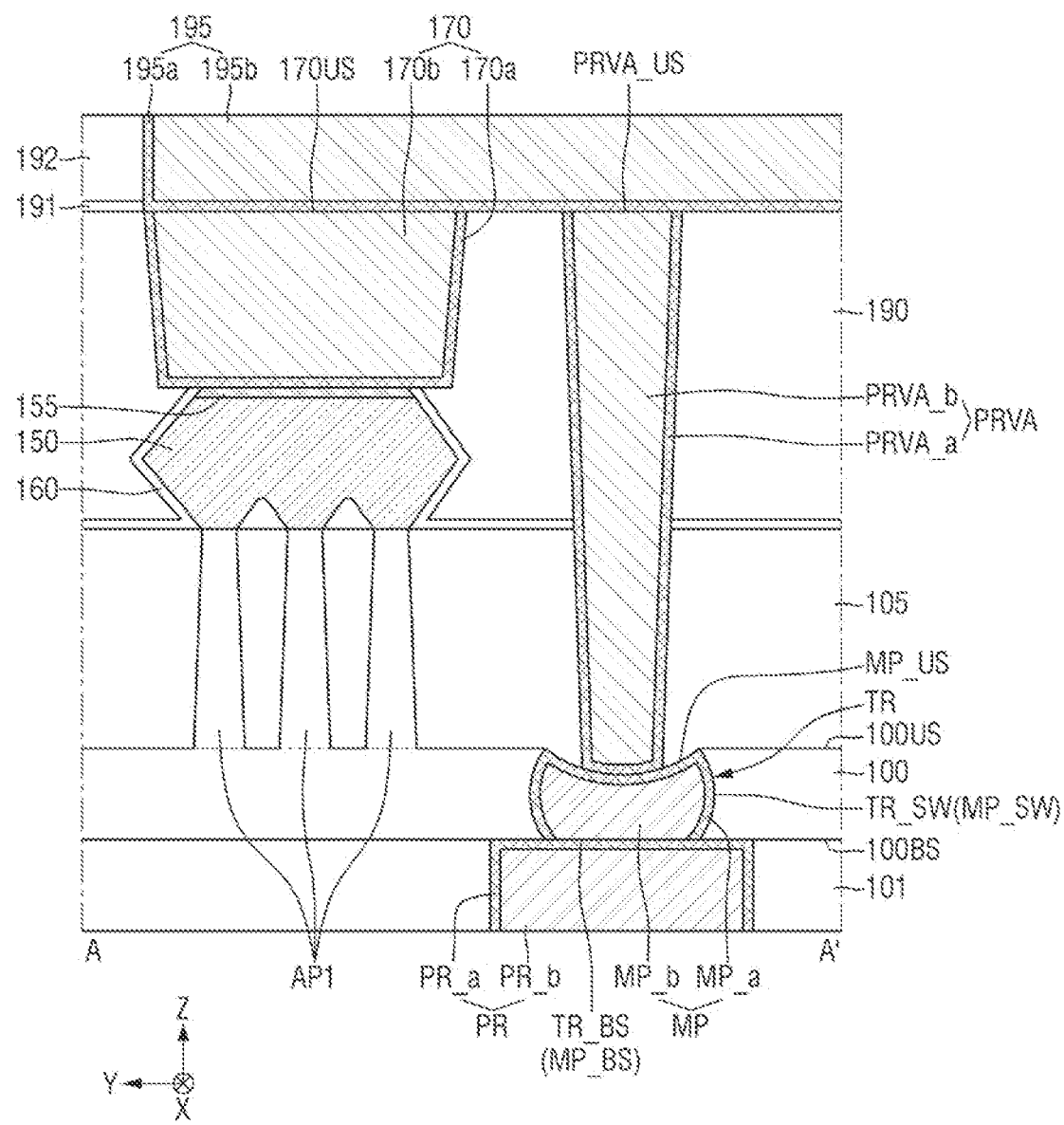
FIG. 2 is an illustrative cross-sectional view taken along a line A-A' in FIG. 1.
Figure 3:
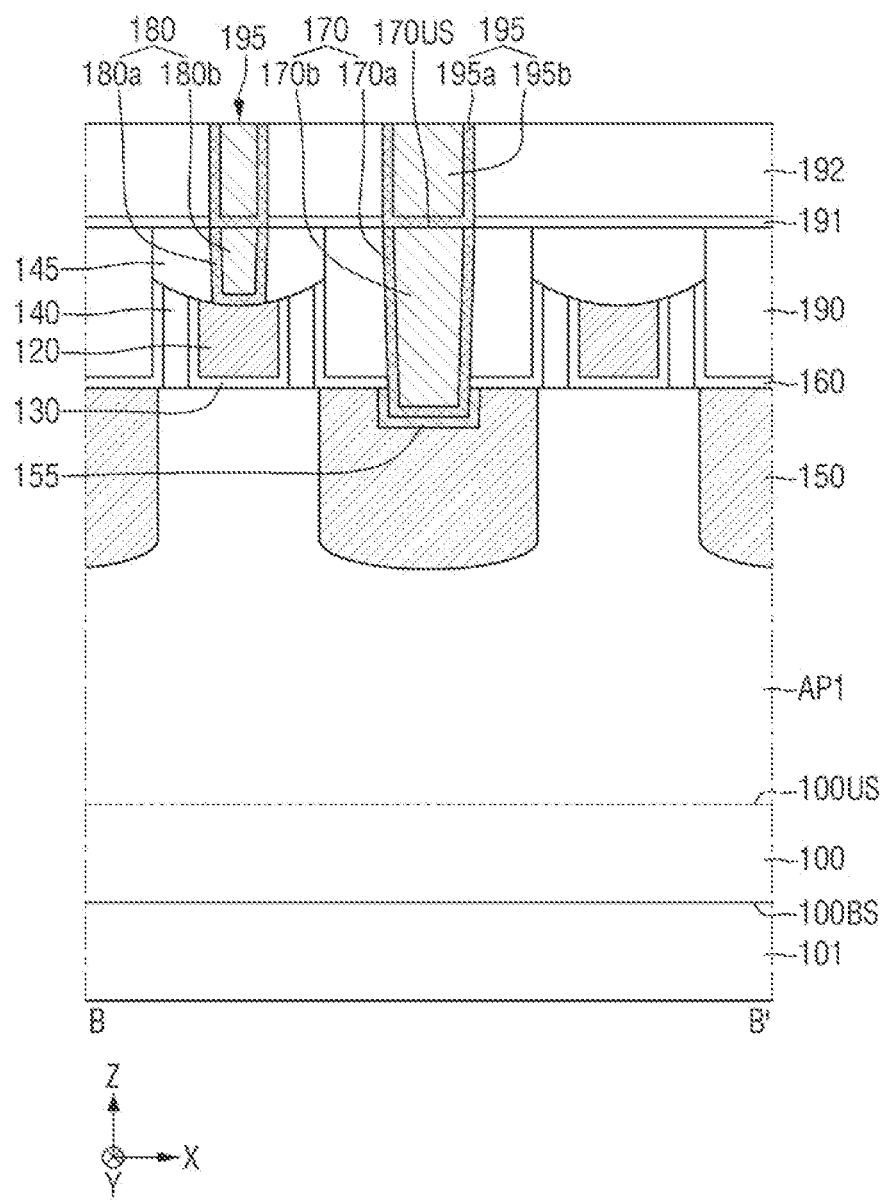
FIG. 3 is an illustrative cross-sectional view taken along a line B-B' in FIG. 1.
Figure 4:
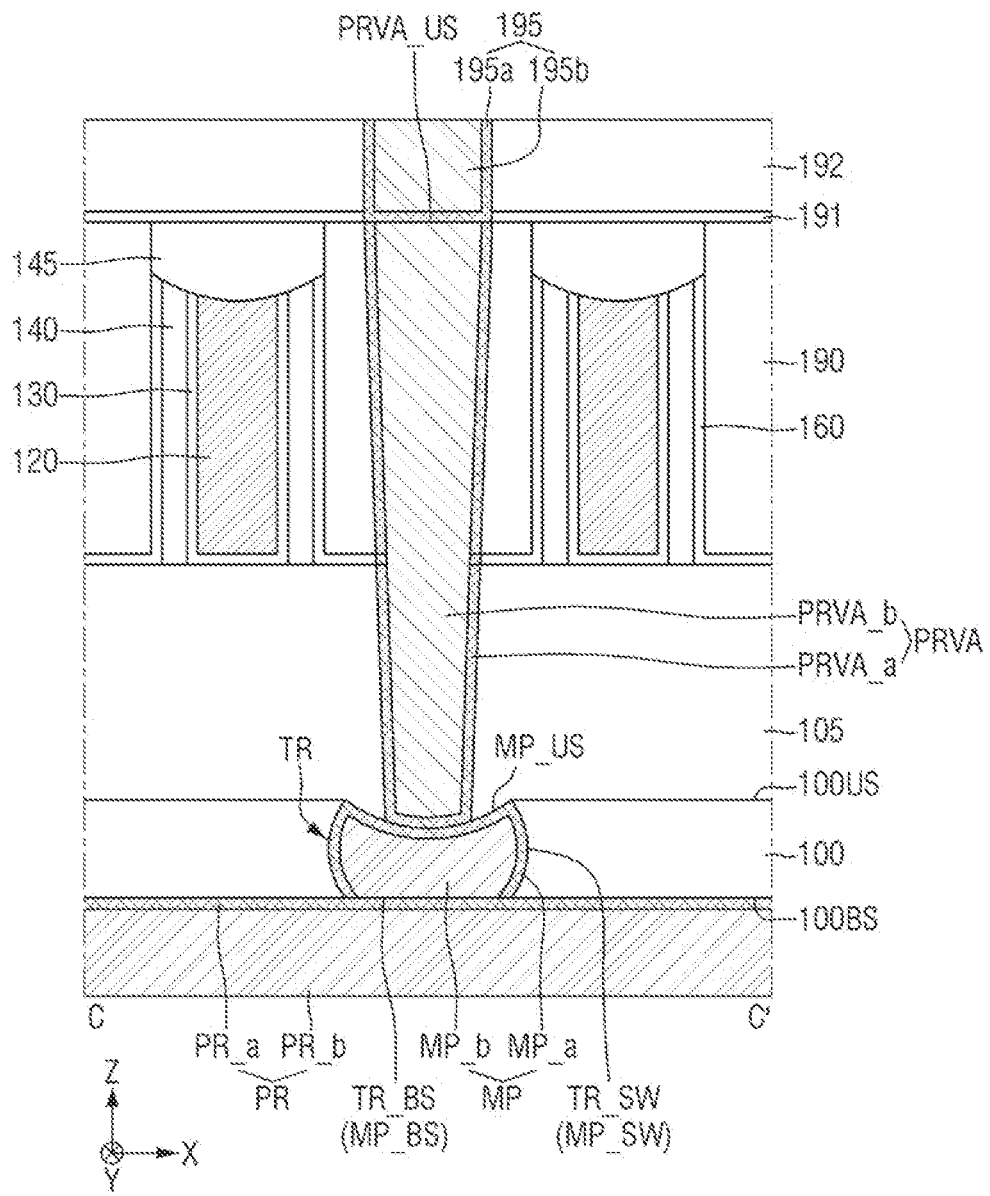
FIG. 4 is an illustrative cross-sectional view taken along a line C-C' in FIG. 1.

FIG. 1 is an illustrative layout diagram for illustrating a semiconductor device according to some embodiments. FIG. 2 is an illustrative cross-sectional view taken along a line A-A' in FIG. 1. FIG. 3 is an illustrative cross-sectional view taken along a line B-B' in FIG. 1. FIG. 4 is an illustrative cross-sectional view taken along a line C-C' in FIG. 1. For convenience of illustration, a via plug 195 are not shown in FIG. 1.

Referring to FIG. 1 to FIG. 4, the semiconductor device according to an embodiment of the present inventive concept may include a substrate 100, at least one first active pattern AP1, at least one second active pattern AP2, a plurality of gate electrodes 120, a first source/drain contact 170, a second source/drain contact 270, a gate contact, a power rail PR, a power rail via PRVA, and a metal pattern MP.

First, the substrate 100 may be provided. The substrate 100 may include a plurality of active areas and a field area. Each of the plurality of active areas may be an area in which the first active pattern AP1 or the second active pattern AP2 is disposed. The field area may be formed so as to be adjacent to each of the plurality of active areas. A boundary may be defined between the field area and each of the plurality of active areas.

The plurality of active areas are spaced apart from each other. The plurality of active areas may be isolated from each other via the field area. In other words, an element isolation film may be disposed around the plurality of active areas spaced apart from each other. In this regard, a portion of the element isolation film disposed between adjacent ones of the plurality of active areas may be the field area. For example, an area where a channel area of a transistor, which may be an example of a semiconductor device, is formed may be an active area. An area defining the channel area of the transistor formed in the active area may be the field area. In addition, the active area may be an area in which a fin-shaped pattern or a nanosheet used as the channel area of the transistor is formed, and the field area may be an area in which the fin-shaped pattern or the nanosheet used as the channel area is not formed.

The substrate 100 may include an upper surface 100US and a lower surface 100BS opposite to each other in the third direction Z. The substrate 100 may be, for example, a silicon substrate or a silicon-on-insulator (SOI) substrate. In addition, the substrate 100 may include silicon-germanium, silicon germanium on insulator (SGOI), indium antimonide, a lead telluride compound, indium arsenide, indium phosphide, gallium arsenide, or gallium antimonide. However, the present inventive concept is not limited thereto.

Each of the first active pattern AP1 and the second active pattern AP2 may be disposed on the upper surface 100US of the substrate 100. Each of the first active pattern AP1 and the second active pattern AP2 may extend in an elongated manner along the first direction X while being disposed on the substrate 100. The first active pattern AP1 and the second active pattern AP2 may be spaced apart from each other in the second direction Y.

Each of the first active pattern AP1 and the second active pattern AP2 may include a long side extending in the first direction X and a short side extending in the second direction Y. In this regard, the first direction X may intersect the second direction Y and the third direction Z. Further, the second direction Y may intersect with the third direction Z. The third direction Z may be a thickness direction of the substrate 100.

Each of the first active pattern AP1 and the second active pattern AP2 may be a multi-channel active pattern. In the semiconductor device according to some embodiments of the present inventive concept, each of the first active pattern AP1 and the second active pattern AP2 may be, for example, a fin-shaped pattern. Each of the first active pattern AP1 and the second active pattern AP2 may be used as a channel area of a transistor. It is illustrated that each of the number of the first active patterns AP1 and the number of the second active patterns AP2 is three. However, this is intended only for convenience of illustration, and the present inventive concept is not limited thereto. Each of the number of the first active patterns AP1 and the number of the second active patterns AP2 may be at least one.

Each of the first active pattern AP1 and the second active pattern AP2 may be a portion of the substrate 100 or may include an epitaxial layer grown from the substrate 100. Each of the first active pattern AP1 and the second active pattern AP2 may include, for example, an elemental semiconductor material such as silicon or germanium. In addition, each of the first active pattern AP1 and the second active pattern AP2 may include a compound semiconductor. For example, each of the first active pattern AP1 and the second active pattern AP2 may include a group IV-IV compound semiconductor or a group III-V compound semiconductor.

The group IV-IV compound semiconductor may include, for example, a binary compound including two of carbon (C), silicon (Si), germanium (Ge), and tin (Sn), a ternary compound including three thereof, or a compound obtained by doping a group IV element thereto.

The group III-V compound semiconductor may include, for example, a binary compound obtained by combining one of aluminum (Al), gallium (Ga), and indium (In) as a group III element and one of phosphorus (P), arsenic (As), and antimony (Sb) as a group V element with each other, a ternary compound obtained by combining two of aluminum (Al), gallium (Ga), and indium (In) as a group III element and one of phosphorus (P), arsenic (As), and antimony (Sb) as a group V with each other, or a quaternary compound obtained by combining three of aluminum (Al), gallium (Ga), and indium (In) as a group III element and one of phosphorus (P), arsenic (As), and antimony (Sb) as a group V with each other.

In some embodiments of the present inventive concept, the first active pattern AP1 and the second active pattern AP2 may include the same material as each other. For example, each of the first active pattern AP1 and the second active pattern AP2 may be a fin-shaped pattern including silicon. In addition, for example, each of the first active pattern AP and the second active pattern AP2 may be a fin-shaped pattern including silicon-germanium. In another example, the first active pattern AP1 and the second active pattern AP2 may include different materials as each other. For example, one of the first active pattern AP1 and the second active pattern AP2 may be a fin-shaped pattern including silicon, while the other thereof may be a fin-shaped pattern including silicon-germanium.

The field insulating film 105 may be formed on the substrate 100. The field insulating film 105 may be formed on the upper surface 100US of the substrate 100. The field insulating film 105 may be disposed on the metal pattern MP to be described later. The field insulating film 105 may cover an upper surface MP_US of the metal pattern MP. At least a portion of the field insulating film 105 may fill a portion of a trench TR formed in the substrate 100. However, the present inventive concept is not limited thereto.

In some embodiments of the present inventive concept, a bottom surface of the field insulating film 105 defining the metal pattern MP may have a convex shape. For example, the bottom surface of the field insulating film 105 defining the metal pattern MP may be convex toward the lower surface 100BS of the substrate 100. The bottom surface of the field insulating film 105 defining the metal pattern MP may be convex toward the power rail PR. A height from the lower surface 100BS of the substrate 100 to the bottom surface of the field insulating film 105 defining the metal pattern MP may be smaller than the thickness of other portions of the substrate 100. For example, the height from the lower surface 100BS of the substrate 100 to the bottom surface of the convex portion of the field insulating film 105 may be smaller than the thickness of other portions of the substrate 100. However, the present inventive concept is not limited thereto.

The field insulating film 105 may cover a sidewall of the first active pattern AP1. For example, the field insulating film 105 may cover a sidewall of the second active pattern AP2. The field insulating film 105 may include, for example, an oxide film, a nitride film, an oxynitride film, or a combination thereof. The field insulating film 105 is shown as a single film. However, the present inventive concept is not limited thereto. For example, the field insulating film 105 may include a field liner extending along a sidewall and a bottom surface of a fin trench and a field filling film on the field liner.

The plurality of gate electrodes 120 may be disposed on the substrate 100. For example, the plurality of gate electrodes 120 may be disposed on the field insulating film 105. Each of the plurality of gate electrodes 120 may extend in the second direction Y. The plurality of gate electrodes 120 may be spaced apart from each other in the first direction X.

The plurality of gate electrodes 120 may be disposed on the first active pattern AP1 and the second active pattern AP2. The plurality of gate electrodes 120 may cover the first active pattern AP1 and the second active pattern AP2. Each of the plurality of gate electrodes 120 may intersect the first active pattern AP1 and the second active pattern AP2. Each of the plurality of gate electrodes 120 may include a long side extending in the second direction Y and a short side extending in the first direction X.

In FIG. 3 and FIG. 4, an upper surface of each of the plurality of gate electrodes 120 may be a concave curved face recessed toward an upper surface of the first active pattern AP1. However, the present inventive concept is not limited thereto. For example, the upper surface of each of the plurality of gate electrodes 120 may be a flat plane.

Each of the plurality of gate electrodes 120 may include at least one of, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), or combinations thereof. The present inventive concept is not limited thereto.

Each of the plurality of gate electrodes 120 may include, for example, a conductive metal oxide, a conductive metal oxynitride, and the like. In this regard, the conductive metal oxide, and the conductive metal oxynitride may include oxidized products of the above-mentioned materials. The present inventive concept is not limited thereto.

Each of the plurality of gate electrodes 120 may be disposed on each of both opposing sides of a source/drain pattern 150 to be described later.

In one example, each of the gate electrodes 120 disposed on each of both opposing sides of the source/drain pattern 150 may act as a normal gate electrode used as a gate of a transistor. In another example, the gate electrode 120 disposed on one side of the source/drain pattern 150 may be used as a gate of a transistor, while the gate electrode 120 disposed on the other side of the source/drain pattern 150 may act as a dummy gate electrode.

Each of a plurality of gate spacers 140 may be disposed on a sidewall of each of the plurality of gate electrodes 120. For example, each of the plurality of gate spacers 140 does not contact each of the plurality of gate electrodes 120. A gate insulating film 130 may be disposed between the gate spacer 140 and the sidewall of the gate electrode 120. Each of the plurality of gate spacers 140 may extend in the second direction Y. Each of the plurality of gate spacers 140 may include, for example, at least one of silicon nitride (SiN), silicon oxynitride (SiON), silicon oxide ($SiO_2$), silicon oxycarbonitride (SiOCN), silicon boron nitride (SiBN), silicon oxyboronitride (SiOBN), silicon oxycarbide (SiOC), or combinations thereof.

The gate insulating film 130 may extend along the sidewall and a bottom surface of each of the plurality of gate electrodes 120. The gate insulating film 130 may be formed on the first active pattern AP1, the second active pattern AP2, and the field insulating film 105. The gate insulating film 130 may be formed between each of the plurality of gate electrodes 120 and each of the plurality of gate spacers 140.

The gate insulating film 130 may include, for example, silicon oxide, silicon oxynitride, silicon nitride, or a high dielectric constant (high-k) material having a higher dielectric constant than that of silicon oxide. The high dielectric constant (high-k) material may include at least one of, for example, boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and/or lead zinc niobate.

The gate insulating film 130 is illustrated as being embodied as a single film. However, this is intended only for convenience of illustration, and the present inventive concept is not limited thereto. The gate insulating film 130 may be embodied as a stack of a plurality of films. The gate insulating film 130 may include an interfacial film disposed between the first active pattern AP1 and the gate electrode 120 and between the second active pattern AP2 and the plurality of gate electrodes 120, and a high dielectric constant insulating film.

The semiconductor device according to some embodiments of the present inventive concept may include an NC (negative capacitance) FET using a negative capacitor. For example, the gate insulating film 130 may include a ferroelectric material film having ferroelectric properties and a paraelectric material film having paraelectric properties.

The ferroelectric material film may have negative capacitance, and the paraelectric material film may have positive capacitance. For example, when two or more capacitors may be connected in series to each other, and capacitance of each of the capacitors has a positive value, a total capacitance is smaller than capacitance of each individual capacitor. In addition, when at least one of capacitances of two or more capacitors connected in series to each other has a negative value, a total capacitance may have a positive value and be greater than an absolute value of each individual capacitance.

When the ferroelectric material film with negative capacitance and the paraelectric material film with positive capacitance are connected in series to each other, a total capacitance value of the ferroelectric material film and the paraelectric material film connected in series to each other may be increased. Using the increase in the total capacitance value, a transistor including the ferroelectric material film may have a subthreshold swing (SS) lower than about 60 mV/decade at room temperature.

The ferroelectric material film may have ferroelectric properties. The ferroelectric material film may include, for example, at least one of hafnium oxide, hafnium zirconium oxide, barium strontium titanium oxide, barium titanium oxide, and/or lead zirconium titanium oxide. In this connection, in one example, hafnium zirconium oxide may refer to a material obtained by doping hafnium oxide with zirconium (Zr). In another example, hafnium zirconium oxide may refer to a compound of hafnium (Hf), zirconium (Zr), and oxygen (O).

The ferroelectric material film may further include doped dopants. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr) and/or tin (Sn). A type of the dopant included in the ferroelectric material film may vary depending on a type of the ferroelectric material included in the ferroelectric material film.

When the ferroelectric material film includes hafnium oxide, the dopant included in the ferroelectric material film may include, for example, at least one of gadolinium (Gd), silicon (Si), zirconium (Zr), aluminum (Al), and/or yttrium (Y).

When the dopant is aluminum (Al), the ferroelectric material film may include about 3 to about 8 at % (atomic %) of aluminum. In this connection, a content of the dopant may be a content of aluminum based on a sum of hafnium and aluminum.

When the dopant is silicon (Si), the ferroelectric material film may include about 2 to about 10 at % of silicon. When the dopant is yttrium (Y), the ferroelectric material film may include about 2 to about 10 at % yttrium. When the dopant is gadolinium (Gd), the ferroelectric material film may include about 1 to about 7 at % gadolinium. When the dopant is zirconium (Zr), the ferroelectric material film may include about 50 to about 80 at % zirconium.

The paraelectric material film may have paraelectric properties. The paraelectric material film may include, for example, at least one of silicon oxide and metal oxide having a high dielectric constant. Although the metal oxide included in the paraelectric material film may include, for example, at least one of hafnium oxide, zirconium oxide and aluminum oxide. However, the present inventive concept is not limited thereto.

The ferroelectric material film and the paraelectric material film may include the same material. The ferroelectric material film may have ferroelectric properties, but the paraelectric material film might not have the ferroelectric properties. For example, when each of the ferroelectric material film and the paraelectric material film includes hafnium oxide, a crystal structure of hafnium oxide included in the ferroelectric material film is different from a crystal structure of hafnium oxide included in the paraelectric material film.

The ferroelectric material film may have a thickness sized to exhibit ferroelectric properties. Although the thickness of the ferroelectric material film may be, for example, in a range of about 0.5 to about 10 nm, the present inventive concept is not limited thereto. Because a critical thickness exhibiting the ferroelectric properties may vary based on a type of the ferroelectric material, the thickness of the ferroelectric material film may vary depending on the type of the ferroelectric material.

In one example, the gate insulating film 130 may include one ferroelectric material film. In another example, the gate insulating film 130 may include a plurality of ferroelectric material films spaced apart from each other. The gate insulating film 130 may have a multilayer structure in which a plurality of ferroelectric material films and a plurality of paraelectric material films are alternately stacked on top of each other.

Each of a plurality of gate capping films 145 may be disposed on the upper surface of each of the plurality of gate electrodes 120 and an upper surface of each of the plurality of gate spacers 140. Each of the plurality of the gate capping films 145 may include, for example, at least one of silicon nitride (SiN), silicon oxynitride (SiON), silicon oxide (SiO$_2$), silicon carbonitride (SiCN), silicon oxycarbonitride (SiOCN), or combinations thereof.

The source/drain pattern 150 may be disposed on the substrate 100. The source/drain pattern 150 may be formed on the first active pattern AP1. The source/drain pattern 150 is connected to the first active pattern AP1. A bottom surface of the source/drain pattern 150 contacts the first active pattern AP1.

The source/drain pattern 150 may be disposed at a side face of each of the plurality of gate electrodes 120. The source/drain pattern 150 may be disposed between adjacent ones of the plurality of gate electrodes 120.

For example, the source/drain pattern 150 may be disposed on each of both opposing sides of each of the plurality of gate electrodes 120. For example, the source/drain pattern 150 may be disposed on one side of each of the plurality of gate electrodes 120 and might not be disposed on the other side of each of the plurality of gate electrodes 120.

The source/drain pattern 150 may include an epitaxial pattern. The source/drain pattern 150 may include a semiconductor material. The source/drain pattern 150 may be included in a source/drain of a transistor using the first active pattern AP1 as a channel area.

The source/drain pattern 150 may be connected to a channel area of the first active pattern AP1 that is used as a channel. It is illustrated that the source/drain pattern 150 is a merged structure of three epitaxial patterns respectively formed on three first active patterns AP1. However, this is intended only for convenience of illustration, and the present inventive concept is not limited thereto. For example, the epitaxial patterns respectively formed on the first active patterns AP1 may be isolated from each other.

In one example, an air gap may be disposed in a space between the merged source/drain pattern 150 and the field insulating film 105. In another example, an insulating material may fill a space between the merged source/drain pattern 150 and the field insulating film 105.

An etch stop film 160 may extend along the upper surface of the field insulating film 105, a sidewall of each of the plurality of gate spacers 140, and a profile of the source/drain pattern 150. The etch stop film 160 may be disposed on an upper surface of the source/drain pattern 150, a sidewall of the source/drain pattern 150, and a sidewall of each of the plurality of gate spacers 140. In some embodiments of the present inventive concept, the etch stop film 160 might not disposed on a sidewall of the gate capping film 145. For example, the gate capping film 145 may be disposed on an upper surface of the etch stop film 160. Further, a sidewall of the etch stop film 160 may be connected to an outer sidewall of the gate capping film 145. For example, the sidewall of the etch stop film 160 may be substantially coplanar with the outer sidewall of the gate capping film 145. In an embodiment of the present inventive concept, the etch stop film 160 may be disposed on a sidewall of the gate capping film 145.

The etch stop film 160 may include a material having an etch selectivity with respect to that of a material of a first interlayer insulating film 190 to be described later. The etch stop film 160 may include a nitride-based insulating material. For example, the etch stop film 160 may include at least one of silicon nitride (SiN), silicon oxynitride (SiON), silicon oxycarbonitride (SiOCN), silicon boron nitride (SiBN), silicon oxyboronitride (SiOBN), or combinations thereof.

The first interlayer insulating film 190 is disposed on the etch stop film 160. The first interlayer insulating film 190 may be formed on the field insulating film 105. The first interlayer insulating film 190 may be disposed on the source/drain pattern 150. The first interlayer insulating film 190 might not cover an upper surface of the gate capping film 145. For example, an upper surface of the first interlayer insulating film 190 may be substantially coplanar with the upper surface of the gate capping film 145.

The first interlayer insulating film 190 may include, for example, at least one of silicon oxide, silicon nitride, silicon oxynitride, or a low dielectric constant (low-k) material. The low dielectric constant (low-k) material may include, for example, fluorinated tetraethylorthosilicate (FTEOS), hydrogen silsesquioxane (HSQ), bis-benzocyclobutene (BCB), tetramethylorthosilicate (TMOS), octamethyleyclotetrasiloxane (OMCTS), hexamethyldisiloxane (HMDS), trimethylsilyl borate (TMSB), diacetoxyditertiarybutosiloxane (DADBS), trimethylsilil phosphate (TMSP), polytetrafluoroethylene (PTFE), TOSZ (Tonen SilaZen), FSG (fluoride silicate glass), polyimide nanofoams such as polypropylene oxide, CDO (carbon doped silicon oxide), OSG (organo silicate glass), SiLK, amorphous fluorinated carbon, silica aerogels, silica xerogels, mesoporous silica, or combinations thereof. However, the present inventive concept is not limited thereto.

The first source/drain contact 170 may be disposed on the source/drain pattern 150 that is disposed on the first active pattern AP1. The second source/drain contact 270 may be disposed on the source/drain pattern 150 disposed on the second active pattern AP2. Since descriptions about the first source/drain contact 170 may be the same as descriptions about the second source/drain contact 270, only the first source/drain contact 170 is described below.

The gate contact 180 may be disposed on and connected to some of the plurality of gate electrodes 120. For example, the gate contact 180 may be disposed at a position overlapping each of some of the plurality of gate electrodes 120.

The first source/drain contact 170 may extend through the etch stop film 160 so as to be connected to the source/drain pattern 150. The first source/drain contact 170 may be disposed on the source/drain pattern 150.

The first source/drain contact 170 may be disposed in the first interlayer insulating film 190. The first source/drain contact 170 may be at least partially surrounded with the first interlayer insulating film 190.

A contact silicide layer 155 may be disposed between the first source/drain contact 170 and the source/drain pattern 150. Although the contact silicide layer 155 is illustrated as being formed along a profile of an interface between the source/drain pattern 150 and the first source/drain contact 170, the present inventive concept is not limited thereto. The contact silicide layer 155 may include, for example, a metal silicide material.

The first interlayer insulating film 190 does not cover an upper surface 170US of the first source/drain contact 170. In one example, the upper surface 170US of the first source/drain contact 170 may not protrude upwardly beyond the upper surface of the gate capping film 145. The upper surface 170US of the first source/drain contact 170 may be substantially coplanar with the upper surface of the gate capping film 145. In another example, the upper surface 170US of the first source/drain contact 170 may protrude upwardly beyond the upper surface of the gate capping film 145.

Further, the upper surface 170US of the first source/drain contact 170 may be substantially coplanar with an upper surface of the gate contact 180. The upper surface 170US of the first source/drain contact 170 may be substantially coplanar with an upper surface PRVA_US of the power rail via PRVA.

In some embodiments of the present inventive concept, the first source/drain contact 170 may include a source/drain barrier film 170*a* and a source/drain filling film 170*b* disposed on the source/drain barrier film 170*a*.

A bottom surface of the first source/drain contact 170 is illustrated as having a flat surface. However, the present inventive concept is not limited thereto. In another example, the bottom surface of the first source/drain contact 170 may have a wavy shape or an uneven surface.

The source/drain barrier film 170*a* may include, for example, at least one of tantalum (Ta), tantalum nitride (TaN), titanium (Ti), titanium nitride (TiN), titanium silicon nitride (TiSiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh), and/or a two-dimensional (2D) material. In the semiconductor device according to some embodiments of the present inventive concept, the 2D material may be a metallic material and/or a semiconductor material. The two-dimensional material (2D material) may include a two-dimensional allotrope or a two-dimensional compound. For example, the two-dimensional material (2D material) may include at least one of graphene, molybdenum disulfide ($MoS_2$), molybdenum diselenide ($MoSe_2$), tungsten diselenide ($WSe_2$), and/or tungsten disulfide ($WS_2$). However, the present inventive concept is not limited thereto. For example, the above-mentioned 2D materials are only listed by way of example. The 2D material that may be included in the semiconductor device of the present inventive concept is not limited to the above-mentioned materials.

The source/drain filling film 170*b* may include at least one of, for example, aluminum (Al), tungsten (W), cobalt (Co), ruthenium (Ru), silver (Ag), gold (Au), manganese (Mn) and/or molybdenum (Mo).

The first source/drain contact 170 is illustrated as including a plurality of conductive films. However, the present inventive concept is not limited thereto. For example, the first source/drain contact 170 may be embodied as a single film.

The gate contact 180 may be disposed on the gate electrode 120. The gate contact 180 may extend through the gate capping film 145 so as to be connected to the gate electrode 120.

In one example, an upper surface of the gate contact 180 may be substantially coplanar with the upper surface of the gate capping film 145. In another example, the upper surface of the gate contact 180 may protrude upwardly beyond the upper surface of the gate capping film 145.

The gate contact 180 may include a gate barrier film 180*a* and a gate filling film 180*b* disposed on the gate barrier film 180*a*. A description about a material included in each of the gate barrier film 180*a* and the gate filling film 180*b* may be the same as the description about that included in each of the source/drain barrier film 170*a* and the source/drain filling film 170*b*.

The gate contact 180 is illustrated as including a plurality of conductive films. However, the present inventive concept is not limited thereto. In another example, the gate contact 180 may be embodied as a single film.

The semiconductor device according to some embodiments of the present inventive concept may further include a lower insulating film 101.

The lower insulating film 101 may be disposed on the lower surface 100BS of the substrate 100. For example, the lower insulating film 101 may contact the lower surface 100BS of the substrate 100. In an embodiment of the present inventive concept, the lower insulating film 101 may contact a bottom surface MP_BS of the metal pattern MP. However, the present inventive concept is not limited thereto.

The lower insulating film 101 may include, for example, at least one of silicon oxide, silicon nitride, silicon oxynitride, or a low dielectric constant material. The low dielectric constant (low-k) material may include, for example, fluorinated tetraethylorthosilicate (FTEOS), hydrogen silsesquioxane (HSQ), bis-benzocyclobutene (BCB), tetramethylorthosilicate (TMOS), octamethyleyclotetrasiloxane (OMCTS), hexamethyldisiloxane (HMDS), trimethylsilyl borate (TMSB), diacetoxyditertiarybutosiloxane (DADBS), trimethylsilil phosphate (TMSP), polytetrafluoroethylene (PTFE), TOSZ (Tonen SilaZen), FSG (fluoride silicate glass), polyimide nanofoams such as polypropylene oxide, CDO (carbon doped silicon oxide), OSG (organo silicate glass), SiLK, amorphous fluorinated carbon, silica aerogels, silica xerogels, mesoporous silica, or combinations thereof. However, the present inventive concept is not limited thereto.

The power rail PR may be disposed between the first active pattern AP1 and the second active pattern AP2. The power rail PR may be disposed in the lower insulating film 101. The lower insulating film 101 may at least partially surround the power rail PR. The power rail PR may extend in an elongate manner in the first direction X. However, the present inventive concept is not limited thereto.

The power rail PR is disposed on the lower surface 100BS of the substrate 100. The power rail PR is disposed in the lower insulating film 101. The power rail PR may contact a bottom surface MP_BS of the metal pattern MP. The power rail PR may be electrically connected to the metal pattern MP.

In some embodiments of the present inventive concept, the power rail PR may be connected to the source/drain pattern 150. For example, the power rail PR may be connected to the source/drain pattern 150 via the metal pattern MP, the power rail via PRVA, the via plug 195, and the first source/drain contact 170. Voltage may be applied to the source/drain pattern 150 via the power rail PR.

In some embodiments of the present inventive concept, the power rail PR may include a power rail barrier film PR_a and a power rail filling film PR_b disposed on the power rail barrier film PR_a. For example, the power rail barrier film PR_a may overlap the power rail filling film PR_b.

A description about a material included in each of the power rail barrier film PR_a and the power rail filling film PR_b may be the same as the description about that included in each of the source/drain barrier film 170a and the source/drain filling film 170b. The power rail PR is illustrated as including a plurality of conductive films. However, the present inventive concept is not limited thereto. In another example, the power rail PR may be embodied as a single film.

In some embodiments of the present inventive concept, a trench TR may be formed in the substrate 100. For example, the trench TR completely penetrates the substrate 100. For example, the bottom surface TR_BS of the trench TR may be coplanar with the lower surface 100BS of the substrate 100. For example, an upper surface of the trench TR may be coplanar with the upper surface 100US of the substrate 100. For example, a thickness of the trench TR may be the same as that of the substrate 100.

In FIG. 2, a width in the second direction Y of the trench TR may gradually increase and then decrease as the trench TR extends in a direction from the lower surface 100BS of the substrate 100 toward the upper surface 100US of the substrate 100. For example, the side surfaces of the trench TR may have a rounded shape. In FIG. 4, a width in the first direction X of the trench TR may gradually increase and then decrease as the trench TR extends in a direction from the lower surface 100BS of the substrate 100 toward the upper surface 100US of the substrate 100. For example, a sidewall TR_SW of the trench TR may have a convex shape in a direction outward from the trench TR. For example, the sidewall TR_SW of the trench TR may be concave toward the metal pattern MP.

In some embodiments of the present inventive concept, a slope of the sidewall TR_SW of the trench TR may gradually decrease and then increase as the trench TR extends in a direction from the lower surface 100BS of the substrate 100 toward the upper surface 100US of the substrate 100. As used herein, the term "a slope of A" may refer to an angle defined between a tangential line at a point on A and a reference line extending along the first direction X and/or an angle defined between a tangential line at a point on A and a reference line extending along the second direction Y. "A" may refer to an element. In other words, the trench TR may have a maximum width at any position between the lower surface 100BS and the upper surface 100US of the substrate 100. At the point where the width of the trench TR is maximum, the slope of the sidewall TR_SW of the trench TR may be about 90°. A width of the bottom surface TR_BS of the trench TR is not a maximum width of the trench TR. A width of an upper surface of the trench TR is not the maximum width of the trench TR.

In some embodiments of the present inventive concept, the metal pattern MP may be disposed in the trench TR. The metal pattern MP may fill at least a portion of the trench TR. The metal pattern MP might not fill an entirety of the trench TR. However, the present inventive concept is not limited thereto. The metal pattern MP may be disposed in the substrate 100. The metal pattern MP may be disposed on the power rail PR. The metal pattern MP may be disposed between the power rail PR and the power rail via PRVA. The metal pattern MP may be connected to the power rail PR and the power rail via PRVA.

In some embodiments of the present inventive concept, the bottom surface NP_BS of the metal pattern MP may be substantially coplanar with the lower surface 100BS of the substrate 100. The bottom surface MP_BS of the metal pattern MP may extend parallel to the lower surface 100BS of the substrate 100. The bottom surface MP_BS of the metal pattern MP may constitute the bottom surface TR_BS of the trench TR.

In FIG. 2, a width in the second direction Y of the metal pattern MP may gradually increase and then decrease as the metal pattern MP extends in a direction from the lower surface 100BS of the substrate 100 toward the upper surface 100US of the substrate 100. In FIG. 4, a width in the first direction X of the metal pattern MP may gradually increase and then decrease as the metal pattern MP extends in a direction from the lower surface 100BS of the substrate 100 toward the upper surface 100US of the substrate 100. For example, a sidewall MP_SW of the metal pattern MP may have a convex shape in a direction outward from the trench TR. The sidewall MP_SW of the metal pattern MP may constitute the sidewall TR_SW of the trench TR.

In some embodiments of the present inventive concept, a slope of the sidewall MP_SW of the metal pattern MP may gradually decrease and then increase as the metal pattern MP extends in a direction from the lower surface 100BS of the substrate 100 toward the upper surface 100US of the substrate 100. In other words, the metal pattern MP may have a maximum width at any position between the lower surface 100BS and the upper surface 100US of the substrate 100. At the point where the width of the metal pattern MP is maximum, the slope of the sidewall MP_SW of the metal pattern MP may be about 90°. The width of the bottom surface MP_BS of the metal pattern MP is not the maximum width of the metal pattern MP.

In some embodiments of the present inventive concept, the upper surface MP_US of the metal pattern MP may be convex toward the lower surface 100BS of the substrate 100. The upper surface MP_US of the metal pattern MP may be an interface between the metal pattern MP and the field insulating film 105. In other words, the interface between the metal pattern MP and the field insulating film 105 may be convex toward the lower surface 100BS of the substrate 100.

As described above, the metal pattern MP does not fill an entirety of the trench TR. The field insulating film 105 may be disposed in a portion of the trench TR remaining after the metal pattern MP fills a portion of the trench. For example, at least a portion of the field insulating film 105 may be disposed in the trench TR. For example, at least a portion of the field insulating film 105 may overlap the substrate 100 in the first direction X and/or the second direction Y.

In some embodiments of the present inventive concept, at least a portion of the power rail via PRVA may be disposed in the trench TR. At least a portion of the power rail via PRVA may overlap the substrate 100 in the first direction X and/or the second direction Y. Further, in some embodiments of the present inventive concept, a height of the upper surface MP_US of the metal pattern MP based on the lower surface 100BS of the substrate 100 may be smaller than a height of the upper surface 100US of the substrate 100 based on the lower surface 100BS of the substrate 100. However, the present inventive concept is not limited thereto.

The metal pattern MP may include a metal pattern barrier film MP_a and a metal pattern filling film MP_b disposed on the metal pattern barrier film MP_a. A description about a material included in each of the metal pattern barrier film MP_a and the metal pattern filling film MP_b may be the same as the description about that included in each of the source/drain barrier film 170a and the source/drain filling film 170b. In another example, the metal pattern MP may be embodied as a single film.

The power rail via PRVA may be disposed on the power rail PR. The power rail via PRVA may be disposed on the metal pattern MP. The power rail via PRVA may be connected to the power rail PR via the metal pattern MP. The power rail via PRVA may be disposed between adjacent ones of the plurality of gate electrodes 120. Further, the power rail via PRVA may be disposed between the first active pattern AP1 and the second active pattern AP2. For example, the power rail via PRVA may be disposed on one side of the source/drain pattern 150. The power rail via PRVA may be disposed between the first source/drain contact 170 and the second source/drain contact 270.

The power rail via PRVA may extend through the first interlayer insulating film 190, the etch stop film 160, and the field insulating film 105 so as to be connected to the metal pattern MP. A bottom surface of the power rail via PRVA may contact the upper surface MP_US of the metal pattern MP.

In some embodiments of the present inventive concept, a height from the lower surface 100BS of the substrate 100 to a bottom surface of the power rail via PRVA may be smaller than the thickness of the substrate 100. Based on the lower surface 100BS of the substrate 100, the bottom surface of the power rail via PRVA may be disposed at a vertical level lower than that of the upper surface 100US of the substrate 100. However, the present inventive concept is not limited thereto.

The first interlayer insulating film 190 might not cover an upper surface PRVA_US of the power rail via PRVA. For example, the upper surface PRVA_US of the power rail via PRVA may be substantially coplanar with the upper surface of the first interlayer insulating film 190. Further, the upper surface PRVA_US of the power rail via PRVA may be substantially coplanar with the upper surface 170US of the first source/drain contact 170. Further, the upper surface PRVA_US of the power rail via PRVA may be substantially coplanar with each of the upper surface of the gate contact 180 and the upper surface of the gate capping film 145.

In some embodiments of the present inventive concept, the power rail via PRVA may include a power rail via barrier film PRVA_a and a power rail via filling film PRVA_b disposed on the power rail via barrier film PRVA_a. A description about a material included in each of the power rail via barrier film PRVA_a and the power rail via filling film PRVA_b may be the same as the description about the description about that included in each of the source/drain barrier film 170a and the source/drain filling film 170b.

An upper stop film 191 may be disposed on the first interlayer insulating film 190, the gate capping film 145, the first source/drain contact 170, the power rail via PRVA, and the gate contact 180. A second interlayer insulating film 192 is disposed on the upper stop film 191.

The upper stop film 191 may include a material having an etch selectivity with respect to that of a material of the second interlayer insulating film 192. The upper stop film 191 may include at least one of, for example, silicon nitride (SiN), silicon oxynitride (SiON), silicon oxycarbonitride (SiOCN), silicon boron nitride (SiBN), silicon oxyboronitride (SiOBN), silicon oxycarbide (SiOC), aluminum oxide (AlO), aluminum nitride (AlN), aluminum oxycarbide (AlOC), or combinations thereof. The upper stop film 191 is shown as a single film. However, the present inventive concept is not limited thereto. The upper stop film 191 might not be formed. The second interlayer insulating film 192 may include, for example, at least one of silicon oxide, silicon nitride, silicon carbonitride, silicon oxynitride, or a low dielectric constant material.

The via plug 195 may be disposed in the second interlayer insulating film 192. The via plug 195 may extend through the upper stop film 191 so as to be directly connected to the first source/drain contact 170 and the power rail via PRVA.

A portion of the via plug 195 may cover the upper surface 170US of the first source/drain contact 170 and the upper surface PRVA_US of the power rail via PRVA. For example, a portion of the via plug 195 may entirely cover the upper surface 170US of the first source/drain contact 170 and the upper surface PRVA_US of the power rail via PRVA. For example, the first source/drain contact 170 and the power rail via PRVA may be connected to one via plug 195.

The via plug 195 may include a via barrier film 195a and a via filling film 195b. The via barrier film 195a may extend along a sidewall and a bottom surface of the via filling film 195b. The via barrier film 195a may include, for example, at least one of tantalum (Ta), tantalum nitride (TaN), titanium (Ti), titanium nitride (TiN), titanium silicon nitride (TiSiN), nickel (Ni), nickel boron (NiB), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh), and/or a two-dimensional material (2D material). The via filling film 105b may include, for example, at least one of aluminum (Al), tungsten (W), cobalt (Co), ruthenium (Ru), copper (Cu), silver (Ag), gold (Au), manganese (Mn) and/or molybdenum (Mo).

Hereinafter, a semiconductor device according to some embodiments of the present inventive concept will be described with reference to FIGS. 5 to 17. For the convenience of description, differences thereof from the descriptions as set forth above with reference to FIG. 1 to FIG. 4 will be set forth below. Accordingly, redundant descriptions may be omitted or briefly discussed.

FIGS. 5 to 13 are diagrams for illustrating a semiconductor device according to some embodiments of the present inventive concept.

Figure 5:
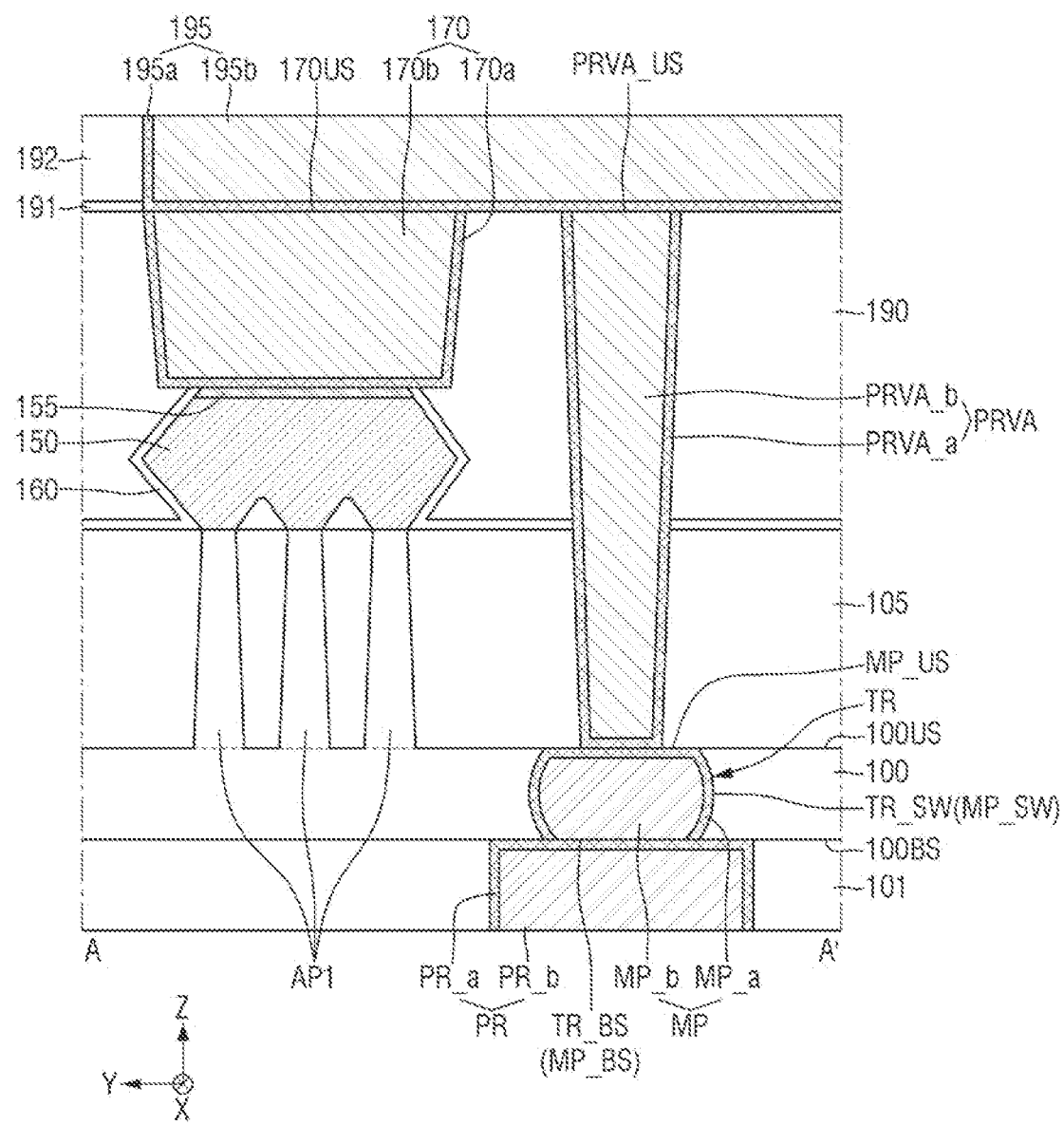
FIGS. 5, 6, 7, 8, 9, 10, 11, 12 and 13 are diagrams for illustrating a semiconductor device according to some embodiments of the present inventive concept.

First, referring to FIG. 5, the upper surface MP_US of the metal pattern MP may be flat. The upper surface MP_US of the metal pattern MP may be parallel to the upper surface 100US of the substrate 100. The upper surface MP_US of the metal pattern MP may be substantially coplanar with the upper surface 100US of the substrate 100.

An interface between the metal pattern MP and the field insulating film 105 may be flat. The interface between the metal pattern MP and the field insulating film 105 may be substantially coplanar with the upper surface 100US of the substrate 100.

The metal pattern MP may fill an entirety of the trench TR. The upper surface MP_US of the metal pattern MP may constitute the upper surface of the trench TR. The field insulating film 105 is not disposed in the trench TR. Further, the power rail via PRVA might not overlap substrate 100 in the first direction X and/or the second direction Y.

In some embodiments of the present inventive concept, the height of the upper surface MP_US of the metal pattern MP based on the lower surface 100BS of the substrate 100 may be equal to the height of the upper surface 100US of the substrate 100 based on the lower surface 100BS of the substrate 100.

Figure 6:
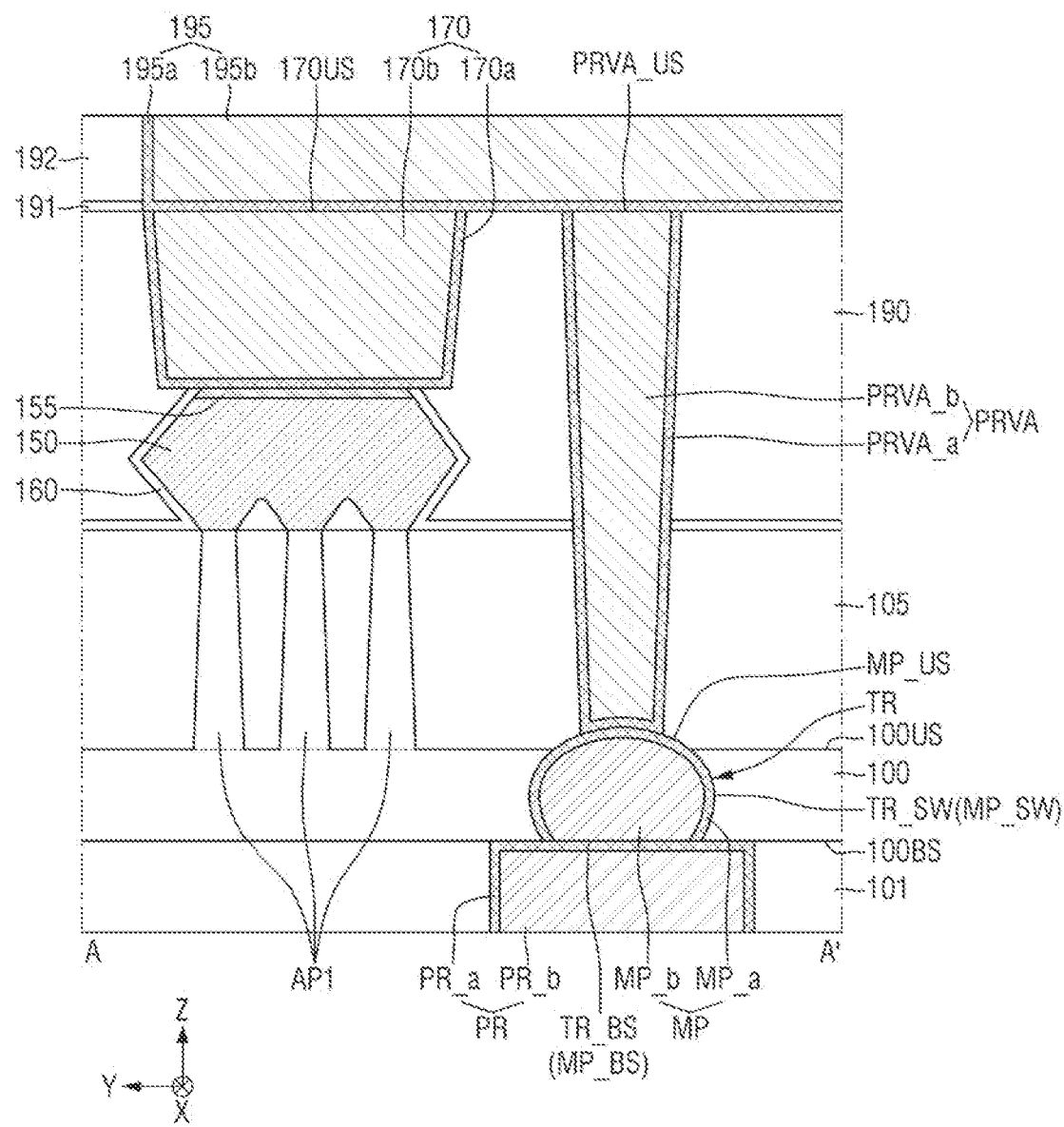

Referring to FIG. 6, the upper surface MP_US of the metal pattern MP may be convex toward the lower surface of the power rail via PRVA. At least a portion of the metal pattern MP may protrude in the third direction Z beyond the upper surface 100US of the substrate 100. The interface between the metal pattern MP and the field insulating film 105 may be concave toward the lower surface 100BS of the substrate 100. For example, the surface of the field insulating film 105 that is directly disposed on the metal pattern MP may be concave.

Figure 7:
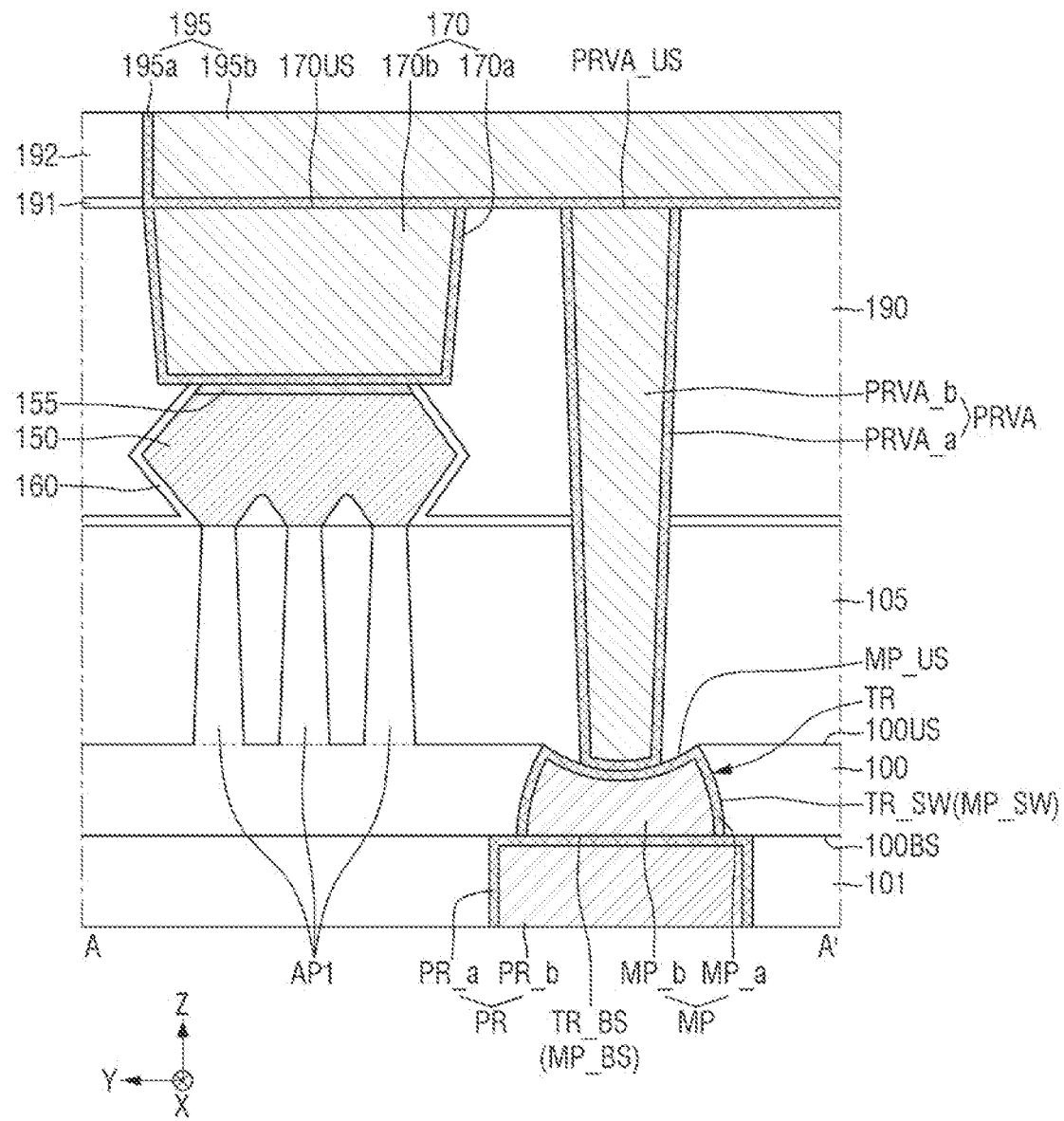

The field insulating film 105 is not disposed in the trench TR. Further, the power rail via PRVA might not overlap substrate 100 in the first direction X and/or the second direction Y. Referring to FIG. 7, the width in the second direction Y of the trench TR gradually decreases as the trench TR extends in a direction from the lower surface 100BS of the substrate 100 toward the upper surface 100US of the substrate 100. The width in the second direction Y of the trench TR does not increase as the trench TR extends in a direction from the lower surface 100BS of the substrate 100 toward the upper surface 100US of the substrate 100. Similarly, the width in the second direction Y of the metal pattern MP gradually decreases as the metal pattern MP extends in a direction from the lower surface 100BS of the substrate 100 toward the upper surface 100US of the substrate 100. The width in the second direction Y of the metal pattern MP does not increase as the metal pattern MP extends in a direction from the lower surface 100BS of the substrate 100 toward the upper surface 100US of the substrate 100.

Each of the width in the first direction X of the trench TR and the width in the first direction X of the metal pattern MP gradually increases as each of the trench TR and the metal pattern MP extends in a direction from the lower surface 100BS of the substrate 100 to the upper surface 100US of the substrate 100. Each of the width in the first direction X of the trench TR and the width in the first direction X of the metal pattern MP does not decrease as each of the trench TR and the metal pattern MP extends in a direction from the lower surface 100BS of the substrate 100 to the upper surface 100US of the substrate 100.

For example, the width of the bottom surface TR_BS of the trench TR may be the maximum width of the trench TR. The width of the bottom surface MP_BS of the metal pattern MP may be the maximum width of the metal pattern MP.

Further, the slope of the sidewall TR_SW of the trench TR gradually decreases as the trench TR extends in a direction from the lower surface 100BS of the substrate 100 toward the upper surface 100US of the substrate 100. The slope of the sidewall TR_SW of the trench TR has a maximum value at the bottom surface TR_BS of the trench TR. The slope of the sidewall MP_SW of the metal pattern MP gradually decreases as the metal pattern MP extends in a direction from the lower surface 100BS of the substrate 100 toward the upper surface 100US of the substrate 100. The slope of the sidewall MP_SW of the metal pattern MP has a maximum value at the bottom surface MP_BS of the metal pattern MP.

Figure 8:
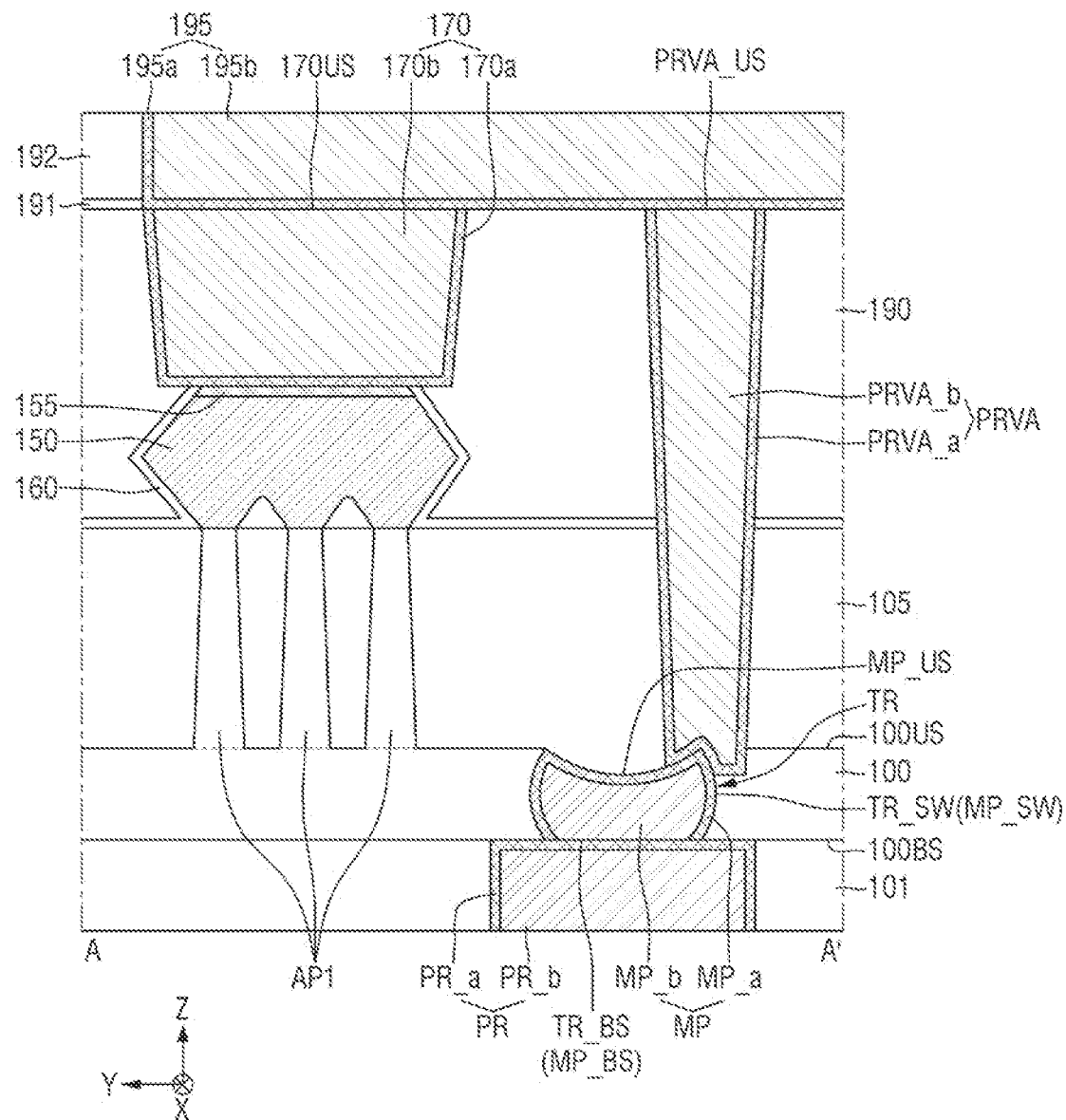

Referring to FIG. 8, the power rail via PRVA may be misaligned with the metal pattern MP. The misalignment between the power rail via PRVA and the metal pattern MP may mean that the bottom surface of the power rail via PRVA does not entirely contact the upper surface MP_US of the metal pattern MP. Further, the power rail via PRVA and the metal pattern MP being misaligned with each other may mean that the power rail via PRVA and the metal pattern MP partially non-overlap with each other in the third direction Z. For example, a bottom surface of the power rail via PRVA may have an uneven surface.

For example, at least a portion of the power rail via PRVA may contact the substrate 100. The at least a portion of the power rail via PRVA is disposed in the substrate 100. At least a portion of the power rail via PRVA contacts the sidewall MP_SW of the metal pattern MP. Since the sidewall MP_SW of the metal pattern MP has a convex structure, the probability that an electrical short circuit occurs due to misalignment between the power rail via PRVA and the metal pattern MP may be reduced. Therefore, the semiconductor device with increased reliability may be manufactured.

Figure 9:
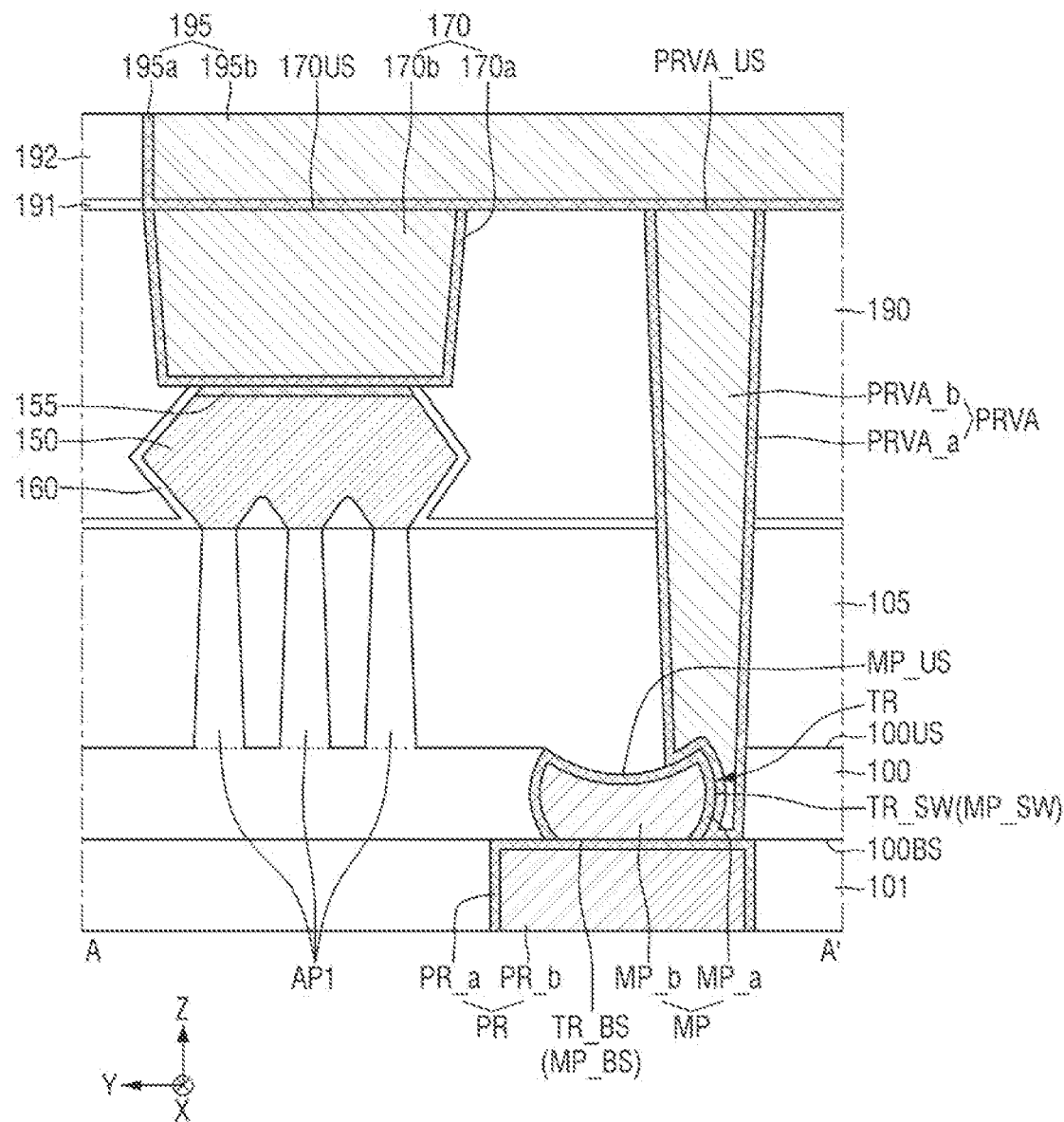

Referring to FIG. 9, the power rail via PRVA may be misaligned with the metal pattern MP. Further, at least a portion of the power rail via PRVA may contact the power rail PR. For example, the bottom surface of the power rail via PRVA may contact the upper surface of the power rail PR. At least a portion of the power rail via PRVA is disposed in the substrate 100. At least a portion of the power rail via PRVA may contact the sidewall MP_SW of the metal pattern MP.

Figure 10:
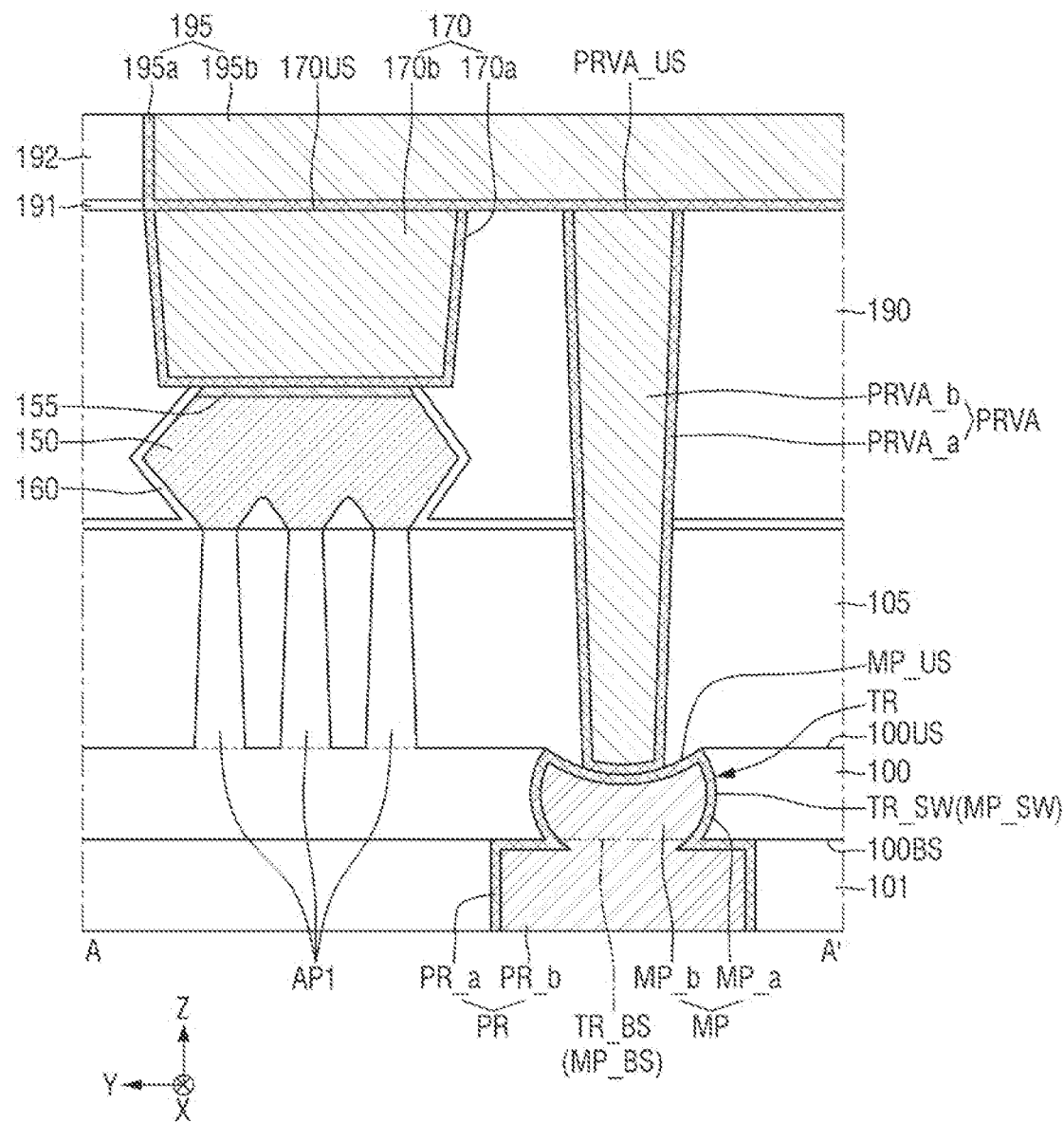

Referring to FIG. 10, the power rail PR and the metal pattern MP may be formed in a single process. For example, a boundary between the power rail PR and the metal pattern MP may be unclear. In this regard, the power rail barrier film PR_a does not extend along the bottom surface MP_BS of the metal pattern MP. The power rail barrier film PR_a and the metal pattern barrier film MP_a may be formed in the same process. For example, the power rail barrier film PR_a may be directly connected to the metal barrier film MP_a. The power rail filling film PR_b and the metal pattern filling film MP_b may be formed in the same process. For example, the power rail filling film PR_b may be directly connected to the metal pattern filling film MP_b.

Figure 11:
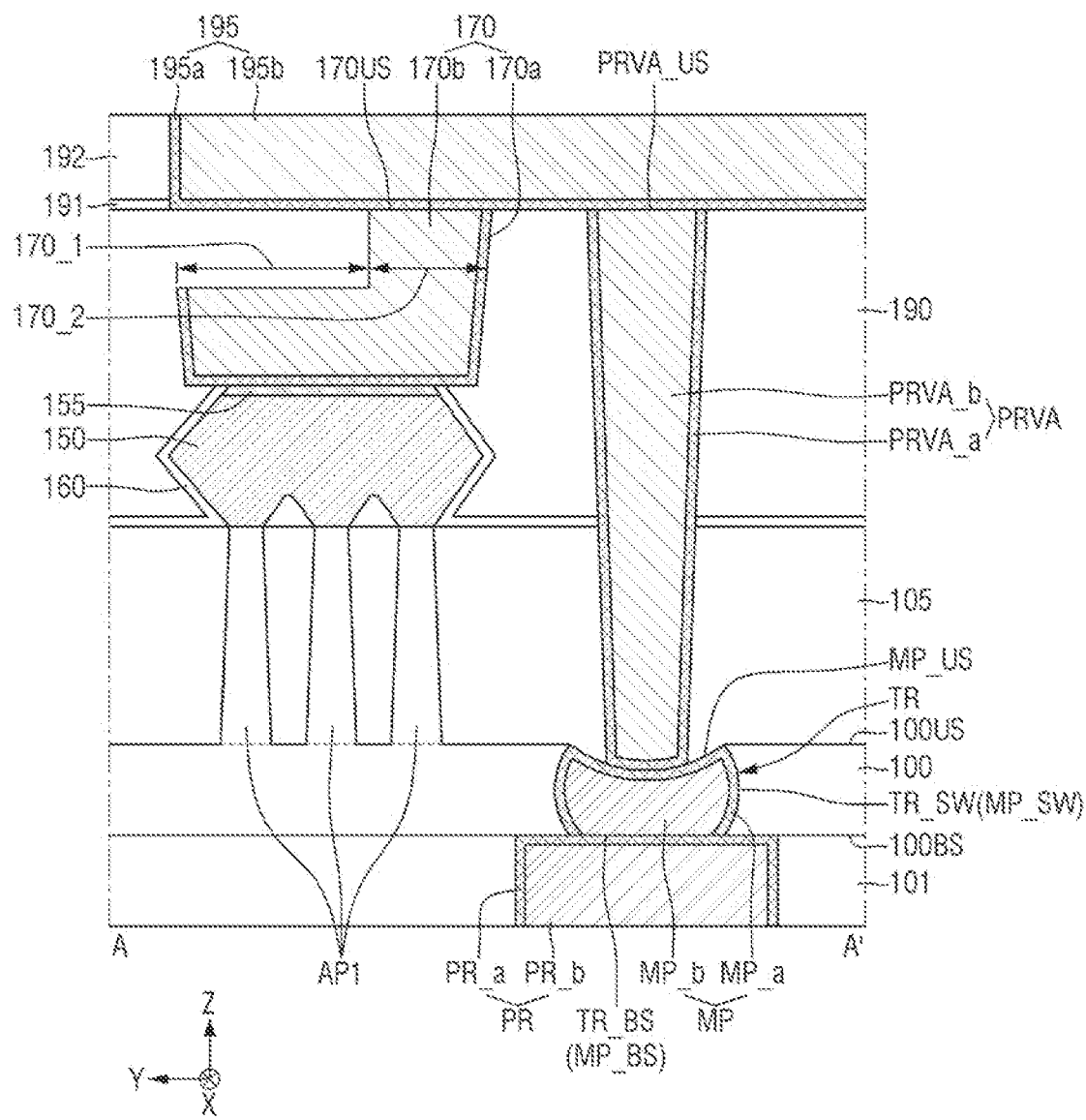

Referring to FIG. 11, in a semiconductor device according to an embodiment of the present inventive concept, the first source/drain contact 170 may include a first portion 170_1 and a second portion 170_2.

The first portion 170_1 of the first source/drain contact 170 may be directly connected to the second portion 170_2 of the first source/drain contact 170. The second portion 170_2 of the first source/drain contact 170 is a portion onto which the via plug 195 is disposed on. The first source/drain contact 170 may be connected to the via plug 195 via the second portion 170_2 of the first source/drain contact 170. The first portion 170_1 of the first source/drain contact 170 is not a portion onto which the via plug 195 is directly disposed on.

For example, the second portion 170_2 of the first source/drain contact 170 may be positioned so as to be connected to the via plug 195. The first portion 170_1 of the first source/drain contact 170 may be positioned so as not to be connected to the via plug 195.

Further, to avoid a short circuit between the gate contact 180 and the first source/drain contact 170, the first portion 170_1 of the first source/drain contact 170 may be positioned on each of both opposing sides of the gate electrode 120 that is connected to the gate contact 180, while the second portion 170_2 of the first source/drain contact 170 might not be positioned on each of both opposing sides of the gate electrode 120 that is connected to the gate contact 180.

A vertical level of an upper surface of the second portion 170_2 of the first source/drain contact 170 is higher than that of an upper surface of the first portion 170_1 of the first source/drain contact 170. Based on the upper surface of the field insulating film 105, a height of the upper surface of the second portion 170_2 of the first source/drain contact 170 is larger than that of the upper surface of the first portion 170_1 of the first source/drain contact 170. For example, the upper surface of the first source/drain contact 170 may be the upper surface of the second portion 170_2 of the first source/drain contact 170.

In FIG. 11, the first source/drain contact 170 is shown as having an 'L' shape. However, the present inventive concept is not limited thereto. For example, the first source/drain contact 170 may have an inverted T-shape. In this case, the first portion 170_1 of the first source/drain contact 170 may be disposed on each of both opposing sides of the second portion 170_2 of the first source/drain contact 170. For example, the second portion 170_2 of the first source/drain contact 170 may be disposed on a central portion of the first portion 170_1 of the first source/drain contact 170.

Figure 12:
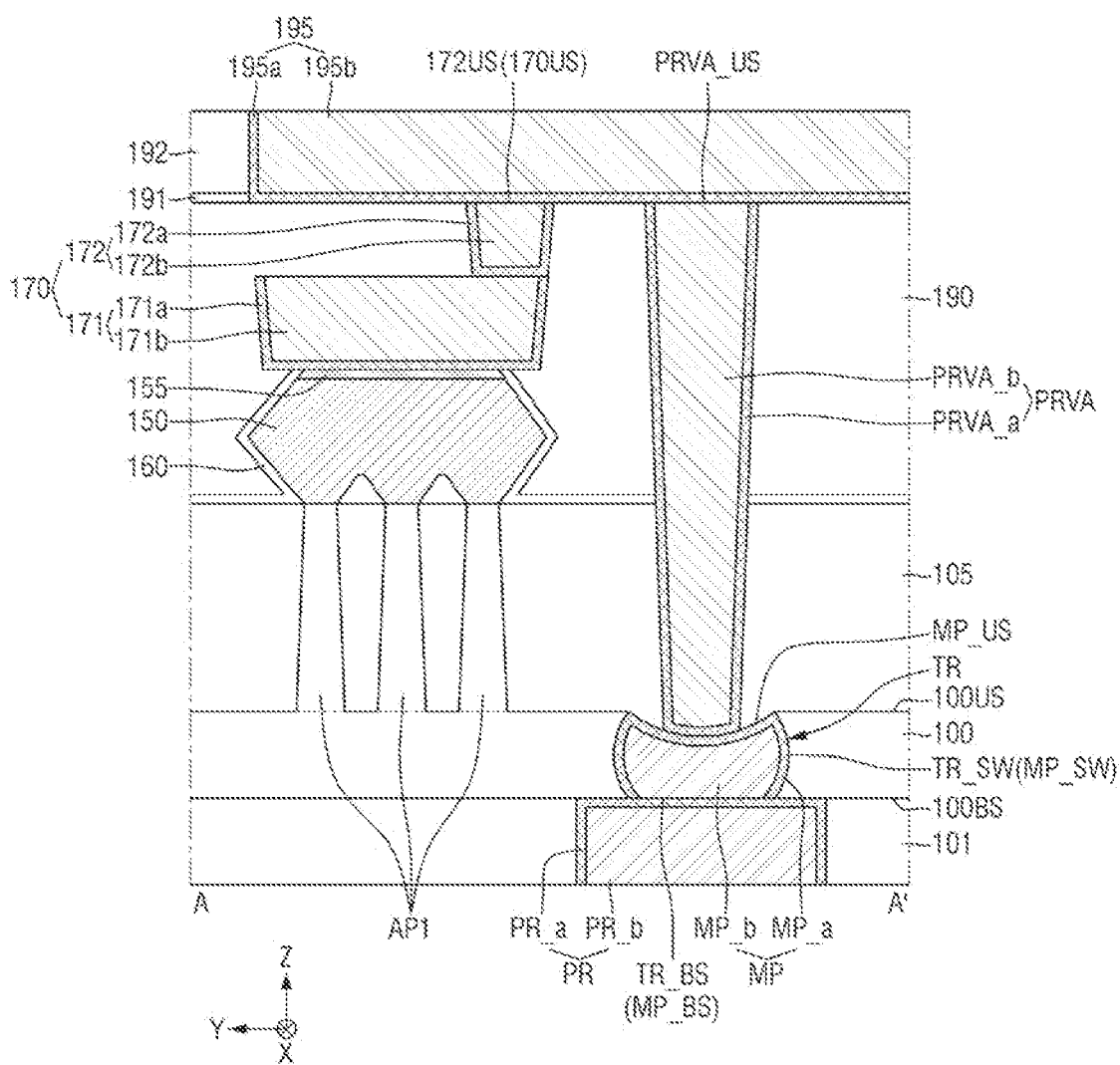

Referring to FIG. 12, in a semiconductor device according to an embodiment of the present inventive concept, the first source/drain contact 170 may include a lower source/drain contact 171 and an upper source/drain contact 172.

The lower source/drain contact 171 may include a lower source/drain barrier film 171a and a lower source/drain filling film 171b. The upper source/drain contact 172 may include an upper source/drain barrier film 172a and an upper source/drain filling film 172b.

The upper surface 170US of the first source/drain contact 170 may be an upper surface 172US of the upper source/drain contact 172.

A description about a material included in each of the lower source/drain barrier film 171a and the upper source/drain barrier film 172a may be the same as the description about the material included in the source/drain barrier film 170a. A description about a material included in each of the lower source/drain filling film 171b and the upper source/drain filling film 172b may be the same as the description about a material included in the source/drain filling film 170b. For example, the upper source/drain contact 172 may be formed as a single film.

Figure 13:
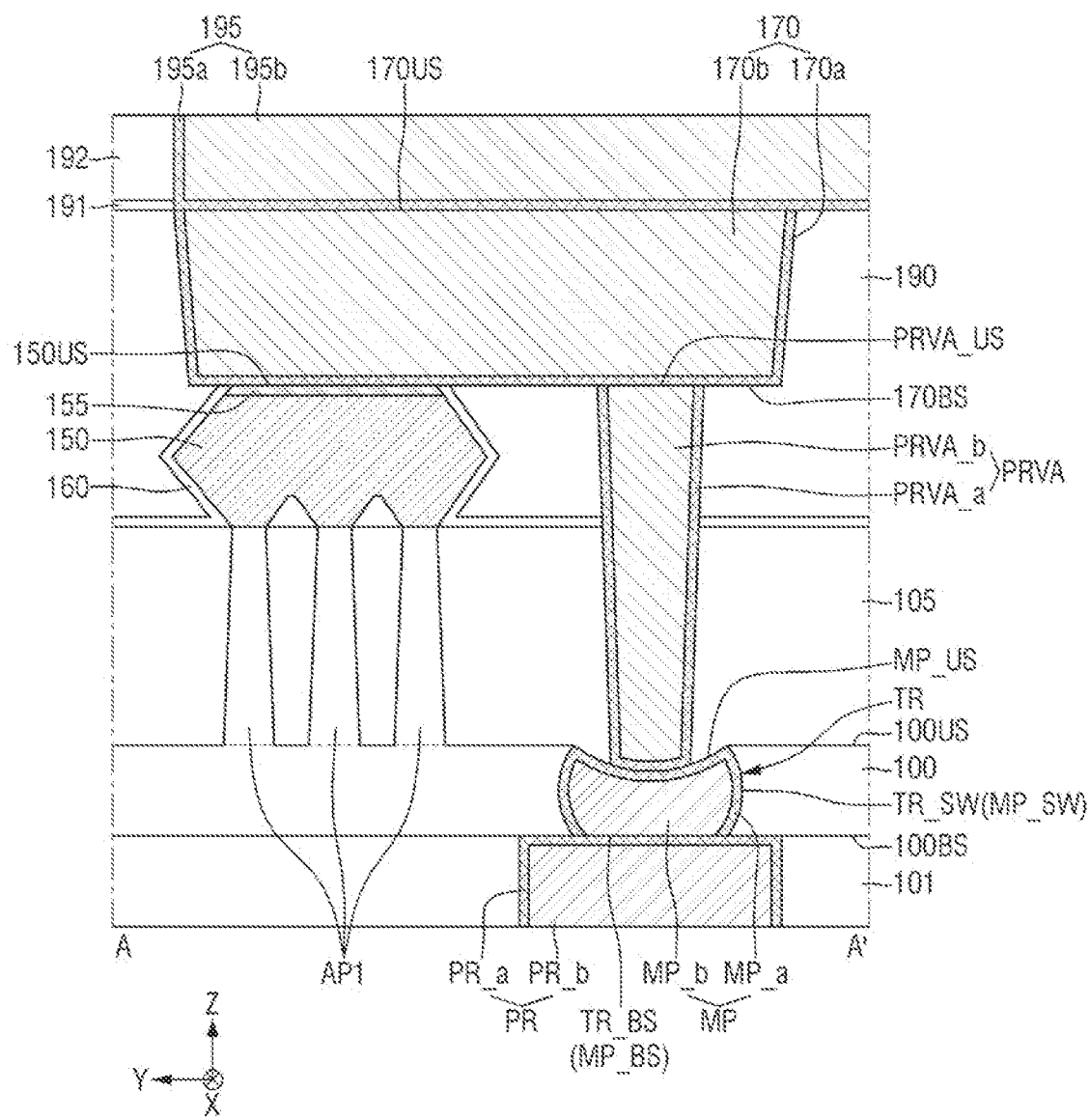

Referring to FIG. 13, the first source/drain contact 170 may extend in an elongate manner in the second direction Y. The first source/drain contact 170 may overlap with the metal pattern MP in the third direction Z. The first source/drain contact 170 may overlap power rail via PRVA in third direction Z.

In some embodiments of the present inventive concept, the bottom surface 170BS of the first source/drain contact 170 may contact the upper surface PRVA_US of the power rail via PRVA. The upper surface PRVA_US of the power rail via PRVA may be substantially coplanar with the upper surface 150US of the source/drain pattern 150. However, the present inventive concept is not limited thereto.

FIGS. 14 to 17 are diagrams for illustrating a semiconductor device according to some embodiments of the present inventive concept.

Figure 14:
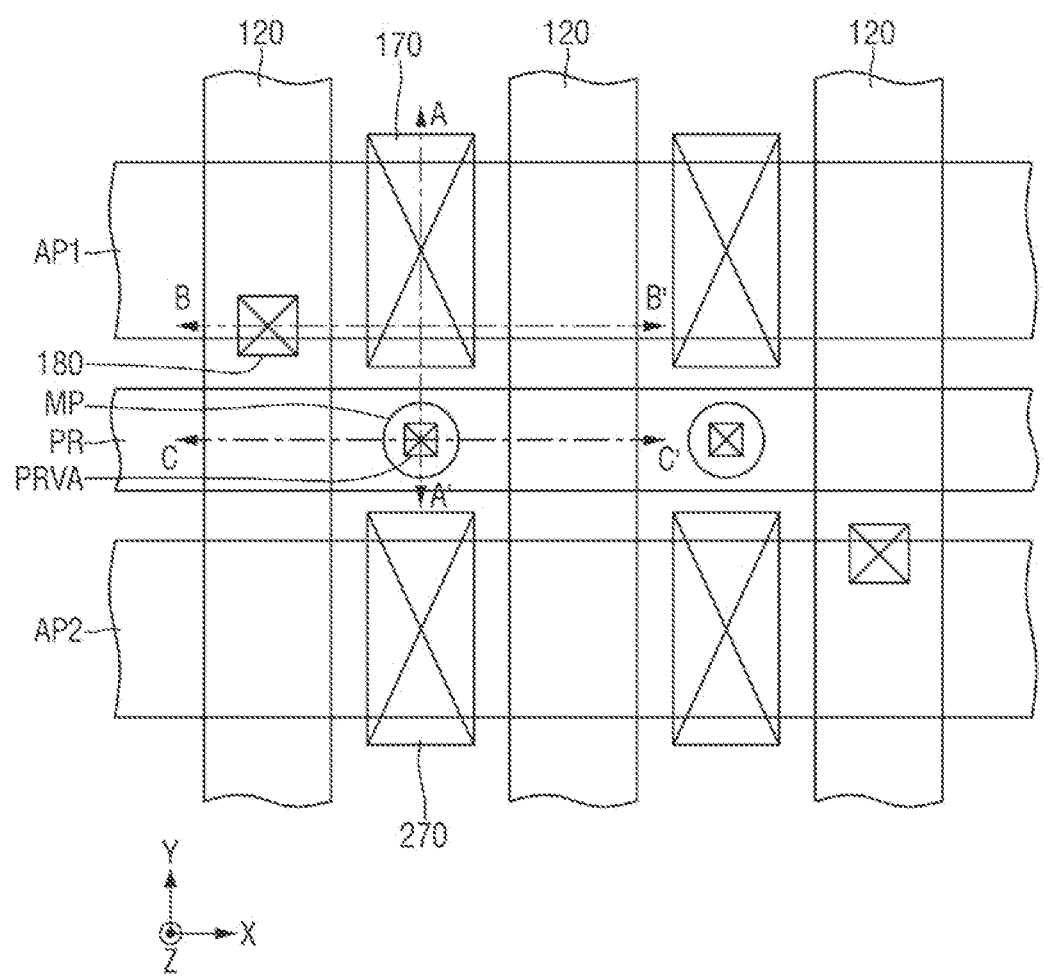
FIGS. 14, 15, 16 and 17 are diagrams for illustrating a semiconductor device according to some embodiments of the present inventive concept.
Figure 15:
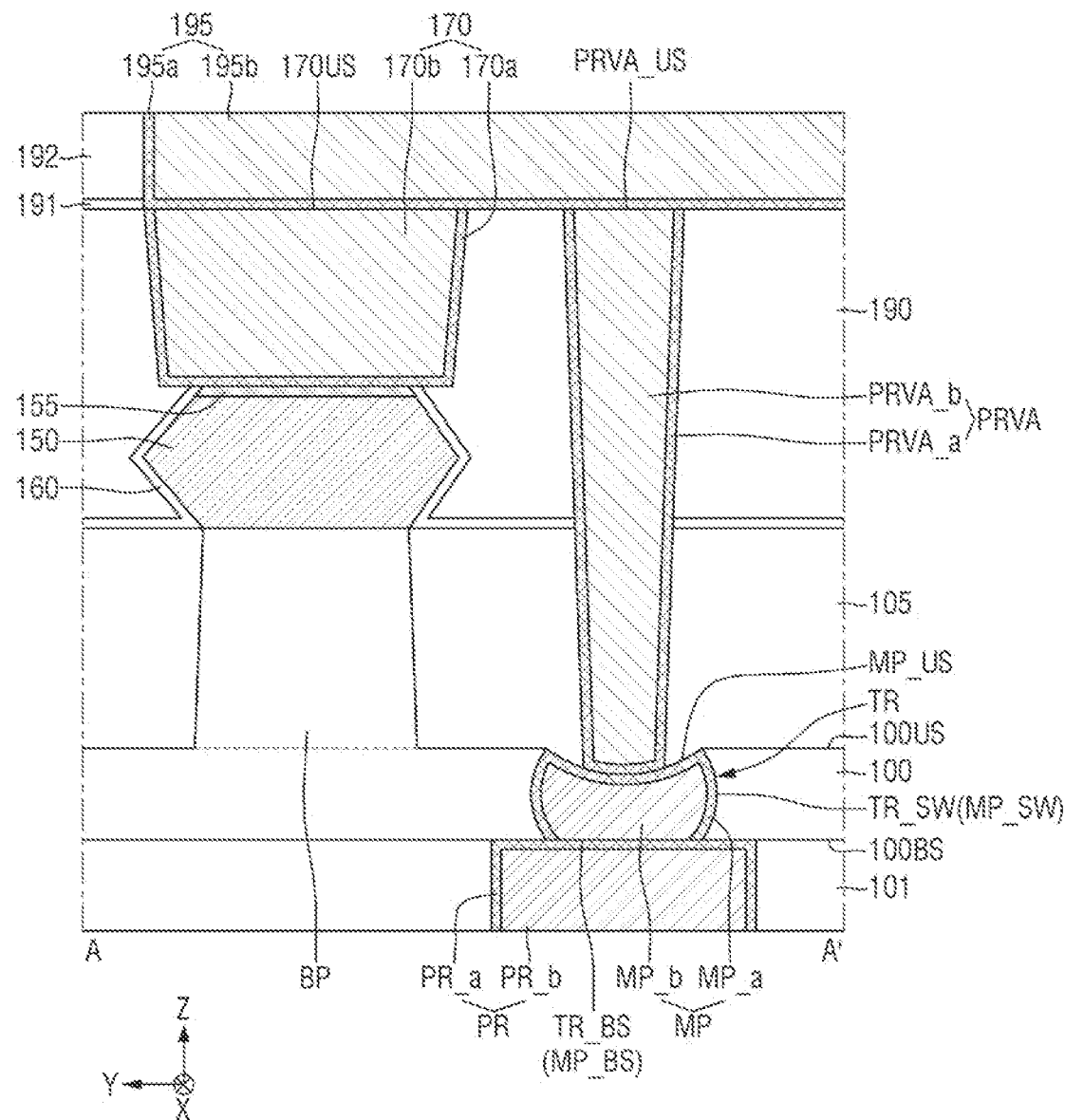
Figure 16:
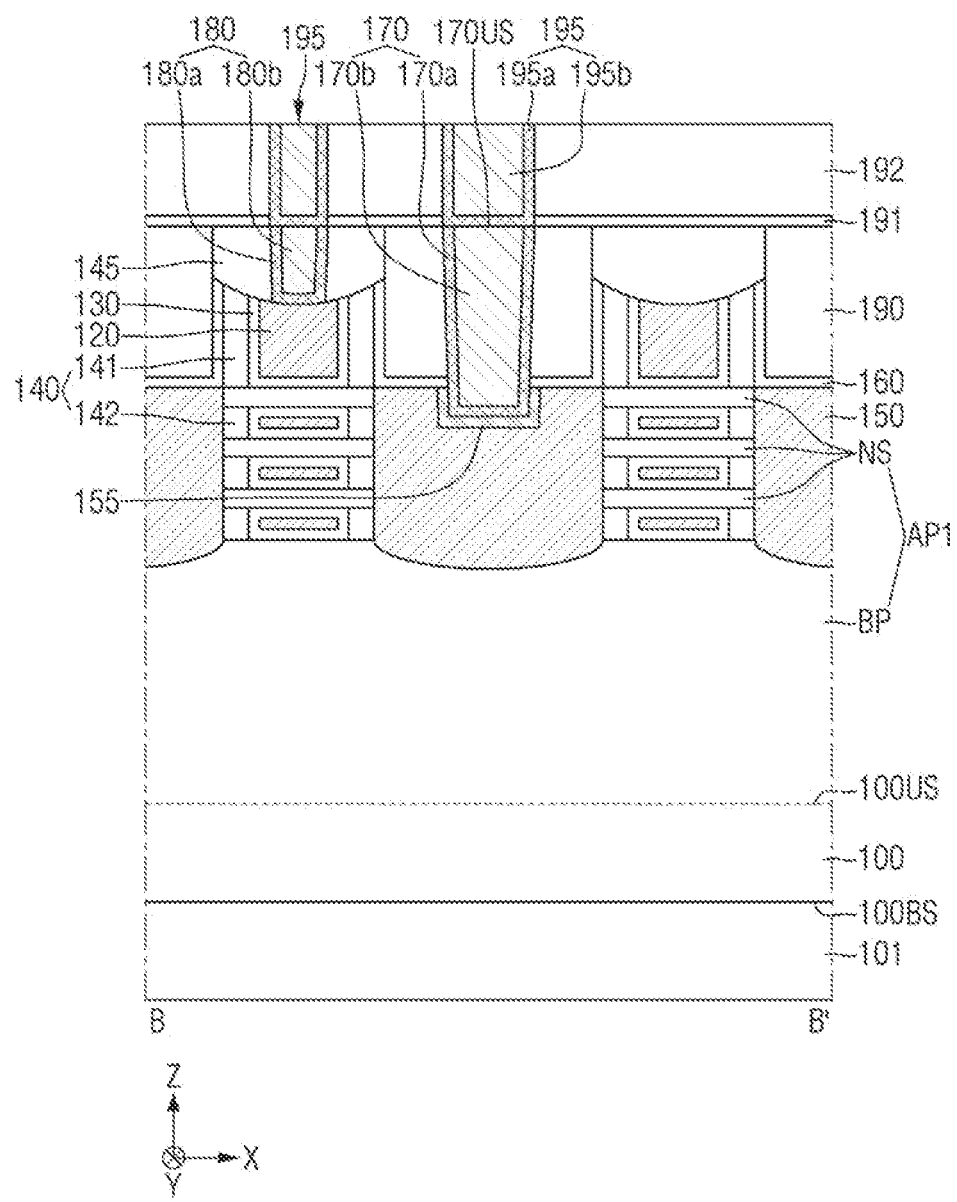
Figure 17:
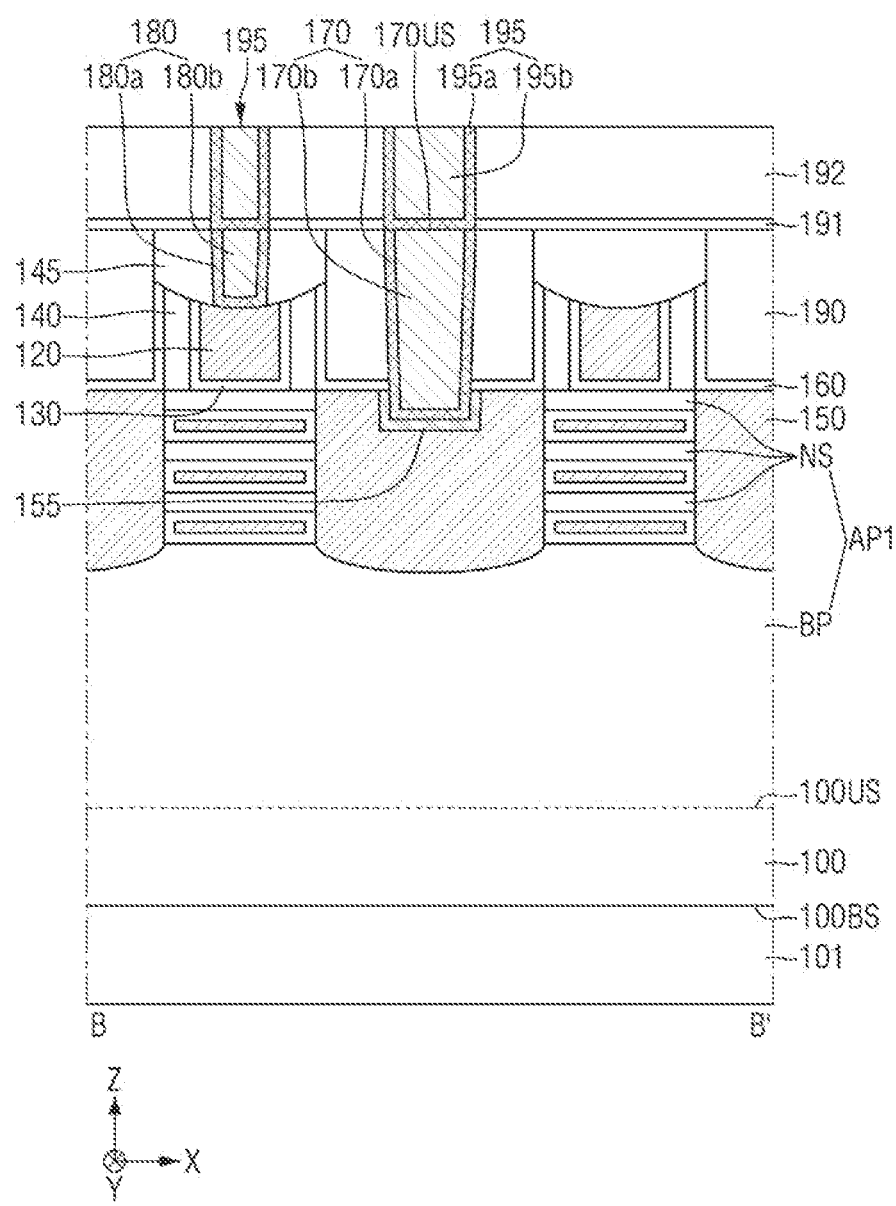

FIG. 14 is an illustrative layout diagram for illustrating a semiconductor device according to an embodiment of the present inventive concept. FIG. 15 is an illustrative cross-section taken along a line A-A' in FIG. 14. Each of FIG. 16 and FIG. 17 is a cross-sectional view taken along a line B-B' in FIG. 14. For the convenience of description, following descriptions are based on differences thereof from those as set forth above using FIGS. 1 to 4. Accordingly, repetitive descriptions may be omitted or briefly discussed.

Referring to FIGS. 14 to 17, in a semiconductor device according to an embodiment of the present inventive concept, the first active pattern AP1 may include a lower pattern BP and at least one sheet pattern NS. The second active pattern AP2 may include a lower pattern and at least one sheet pattern.

The lower pattern BP may extend along the first direction X. The sheet pattern NS may be disposed on the lower pattern BP and spaced apart from the lower pattern BP.

The sheet pattern NS may include a plurality of sheet patterns stacked on each other in the third direction Z. The sheet pattern NS is shown as including three sheet patterns. However, this is only for convenience of illustration. The present inventive concept is not limited thereto. An upper surface of the topmost sheet pattern NS among the sheet patterns NS may act as the upper surface of the first active pattern AP1.

The sheet pattern NS may be connected to the source/drain pattern 150. The sheet pattern NS may act as a channel pattern used as a channel area of a transistor. For example, the sheet pattern NS may be embodied as a nanosheet or a nanowire.

The lower pattern BP may include, for example, an elemental semiconductor material such as silicon or germanium. In addition, the lower pattern BP1 may include a compound semiconductor, for example, a group IV-IV compound semiconductor or a group III-V compound semiconductor.

The sheet pattern NS may include, for example, an elemental semiconductor material such as silicon or germanium. In addition, the sheet pattern NS may include a compound semiconductor, for example, a group IV-IV compound semiconductor or a group III-V compound semiconductor.

The source/drain pattern 150 may be disposed on the lower pattern BP. The source/drain pattern 150 may be disposed between adjacent ones of the plurality of gate electrodes 120. The source/drain pattern 150 may be connected to the sheet pattern NS.

The power rail via PRVA may be disposed on one side of the lower pattern BP. The power rail via PRVA is disposed on one side of the source/drain pattern 150. Further, the power rail via PRVA may be disposed between adjacent ones of the plurality of gate electrodes 120.

The gate insulating film 130 may extend along an upper surface of the lower pattern BP and the upper surface of the field insulating film 105. The gate insulating film 130 may surround the sheet pattern NS.

The gate electrode 120 is disposed on the lower pattern BP. The gate electrode 120 intersects the lower pattern BP. The gate electrode 120 may surround the sheet pattern NS.

In FIG. 16, the gate spacer 140 may include an outer spacer 141 and an inner spacer 142. The inner spacer 142 may be disposed between the lower pattern BP and the bottommost sheet pattern NS, and between the adjacent sheet patterns NS.

In FIG. 17, the gate spacer 140 may include only the outer spacer. No inner spacer is disposed between the lower pattern BP and the bottommost sheet pattern NS, and between the adjacent sheet patterns NS.

FIGS. 18 to 29 are diagrams of intermediate structures corresponding to intermediate steps for illustrating a manufacturing method of a semiconductor device according to an embodiment of the present inventive concept. For reference, FIGS. 18 to 29 may be cross-sectional views taken along a line A-A' of FIG. 1. The manufacturing method will be described below in terms of the cross-sectional view.

Figure 18:
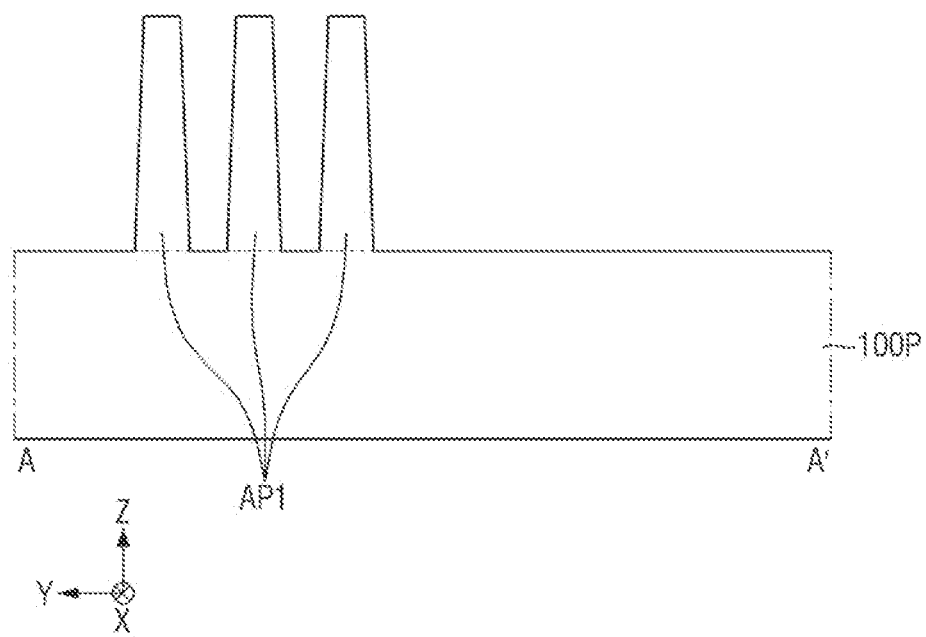
FIGS. 18, 19, 20, 21, 22, 23, 24, 25, 26, 27, 28 and 29 are diagrams of intermediate structures corresponding to intermediate steps for illustrating a manufacturing method of a semiconductor device according to an embodiment of the present inventive concept.

Referring to FIG. 18, a pre-substrate 100P may be provided. The first active pattern AP1 may be formed on the pre-substrate 100P. The second active pattern (AP2 in FIG. 1) may be formed on the pre-substrate 100P. The first active pattern AP1 and the second active pattern AP2 of FIG. 1 may be formed by patterning the pre-substrate 100P. The pre-substrate 100P may be a silicon substrate. However, the present inventive concept is not limited thereto.

Figure 19:
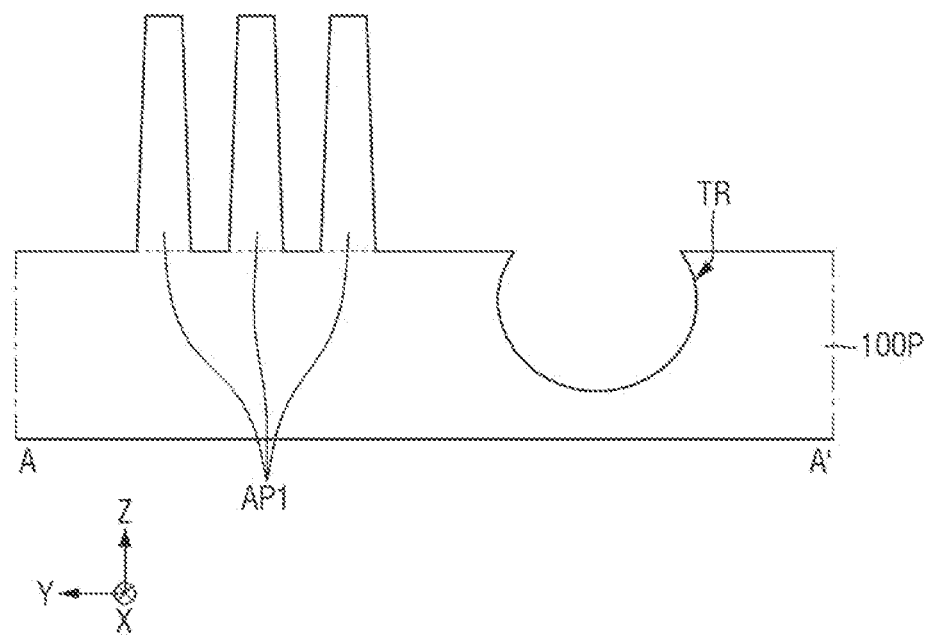

Referring to FIG. 19, the trench TR may be formed in the pre-substrate 100P. The trench TR may be formed in a wet etching process. Accordingly, a profile of the trench TR may be curved. The profile of the trench TR may be concave toward the center of the trench TR. However, the present inventive concept is not limited thereto. For example, the trench TR may have a rounded shape.

Figure 20:
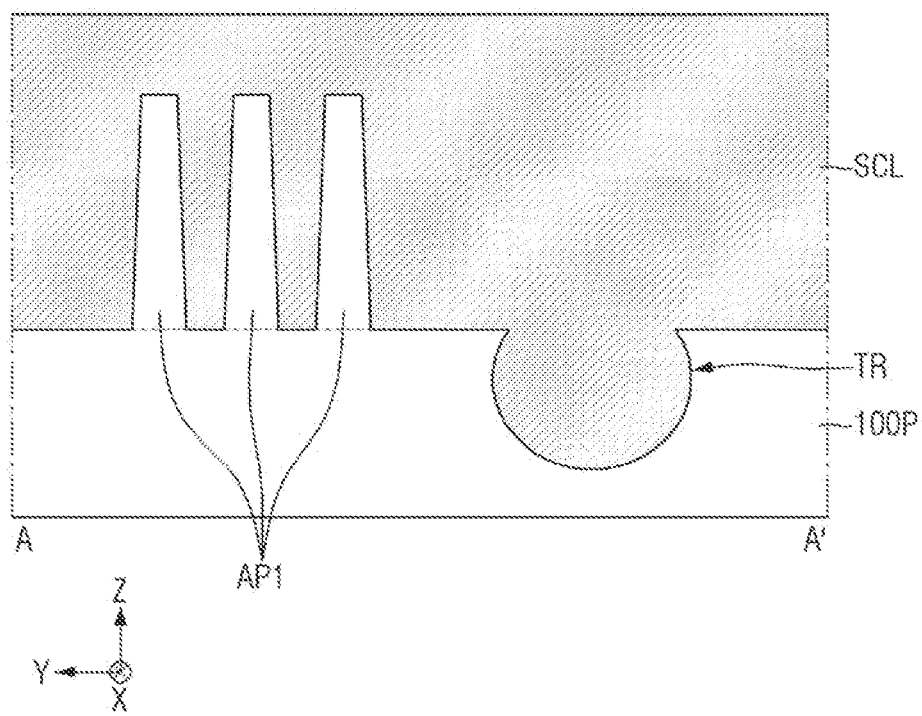

Referring to FIG. 20, a sacrificial film SCL may be formed on the pre-substrate 100P. The sacrificial film SCL may cover the first active pattern AP1 and the pre-substrate 100P. The sacrificial film SCL may fill the trench TR. The sacrificial film SCL may include a material having an etch selectivity with respect to that of a material of each of the pre-substrate 100P and the first active pattern AP1.

Figure 21:
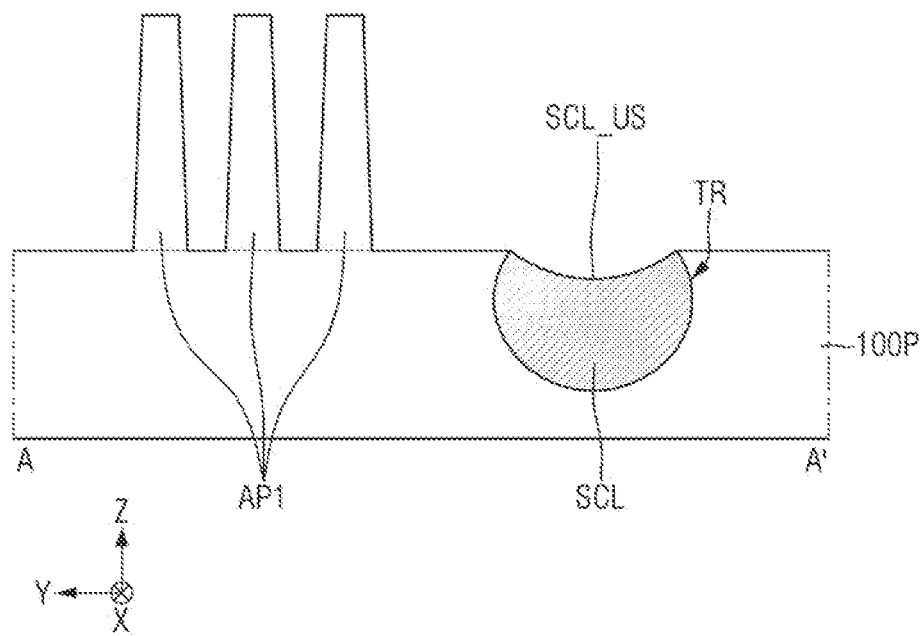

Referring to FIG. 21, the pre-substrate 100P may be exposed by removing a portion of the sacrificial film SCL. Further, a portion of the sacrificial film SCL may be removed to expose the first active pattern AP1. As described above, the sacrificial film SCL has an etch selectivity with respect to that of each of the pre-substrate 100P and the first active pattern AP1, such that the pre-substrate 100P and the first active pattern AP1 might not be removed while the sacrificial film SCL is removed. For example, the sacrificial film SCL may be selectively removed.

In some embodiments of the present inventive concept, an upper surface SCL_US of the sacrificial film SCL in the trench TR may be recessed towards a lower surface of the pre-substrate 100P. This may be because the sacrificial film SCL is over-etched when the sacrificial film SCL is removed.

Figure 22:
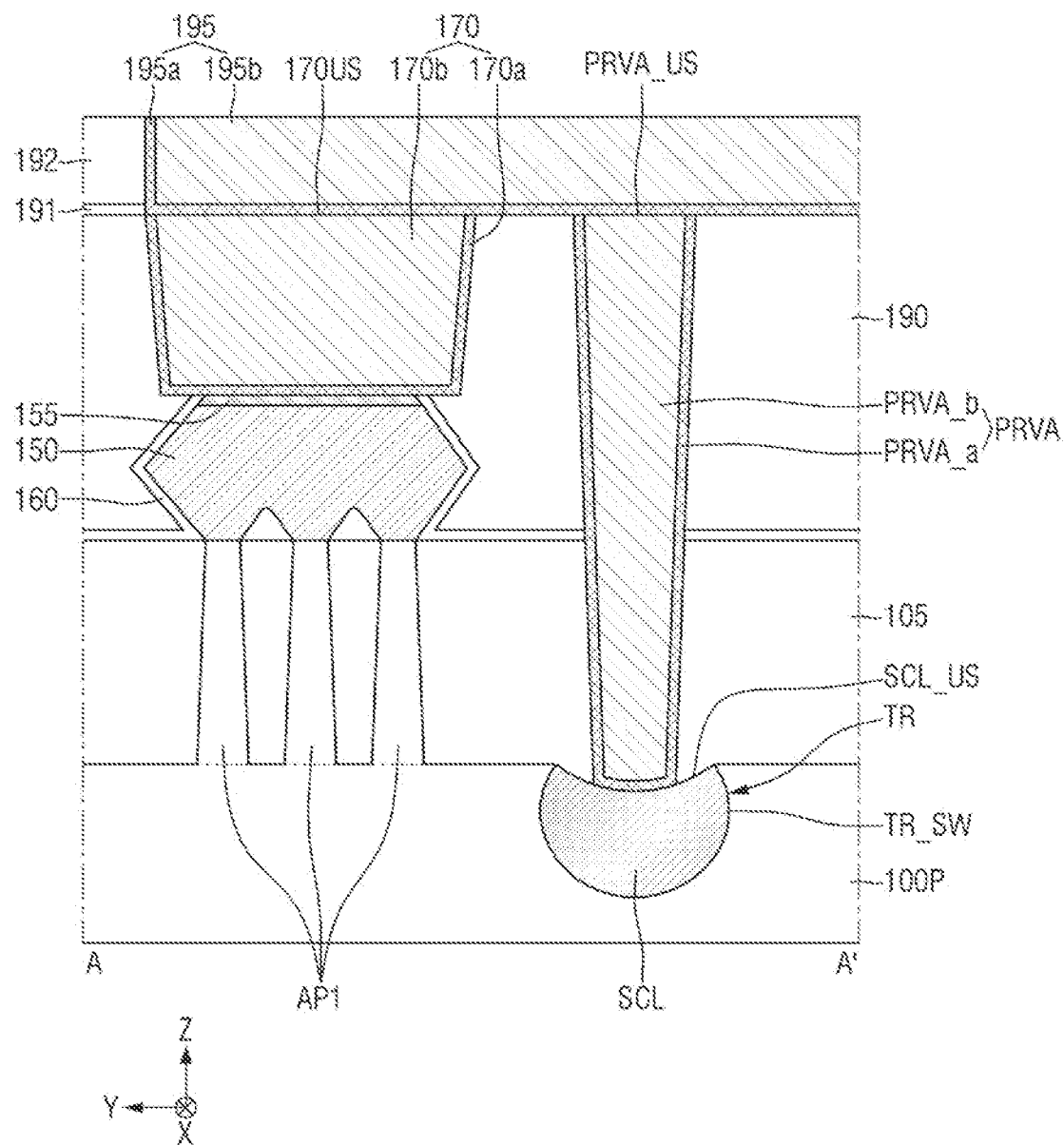

Referring to FIG. 22, the field insulating film 105 may be formed. The field insulating film 105 may cover the upper surface 100US of the substrate 100. The field insulating film 105 may cover the upper surface SCL_US of the sacrificial film SCL. The field insulating film 105 may cover the sidewall of the first active pattern AP1.

Subsequently, the source/drain pattern 150 may be formed. The source/drain pattern 150 is formed on the first active pattern AP1. The source/drain pattern 150 may be an epitaxial pattern.

Then, the etch stop film 160, the first interlayer insulating film 190, the first source/drain contact 170, and power rail via PRVA may be formed.

First, the etch stop film 160 may be formed along the upper surface of the field insulating film 105 and the profile of the source/drain pattern 150. Subsequently, the first interlayer insulating film 190 may be formed on the etch stop film 160.

The first source/drain contact 170 extending through the first interlayer insulating film 190 and the etch stop film 160 is formed on the source/drain pattern 150. At a boundary between the first source/drain contact 170 and the source/drain pattern 150, the contact silicide layer 155 is formed.

Subsequently, the power rail via PRVA extending through the first interlayer insulating film 190, the etch stop film 160, and the field insulating film 105 may be formed on the sacrificial film SCL. The power rail via PRVA may be formed on one side of the source/drain pattern 150. The power rail via PRVA may be formed on one side of the first source/drain contact 170. The power rail via PRVA may be disposed on the upper surface SCL_US of the sacrificial film SCL.

Subsequently, the upper stop film 191, the second interlayer insulating film 192, and the via plug 195 may be formed on the first source/drain contact 170, the power rail via PRVA, and the first interlayer insulating film 190.

Figure 23:
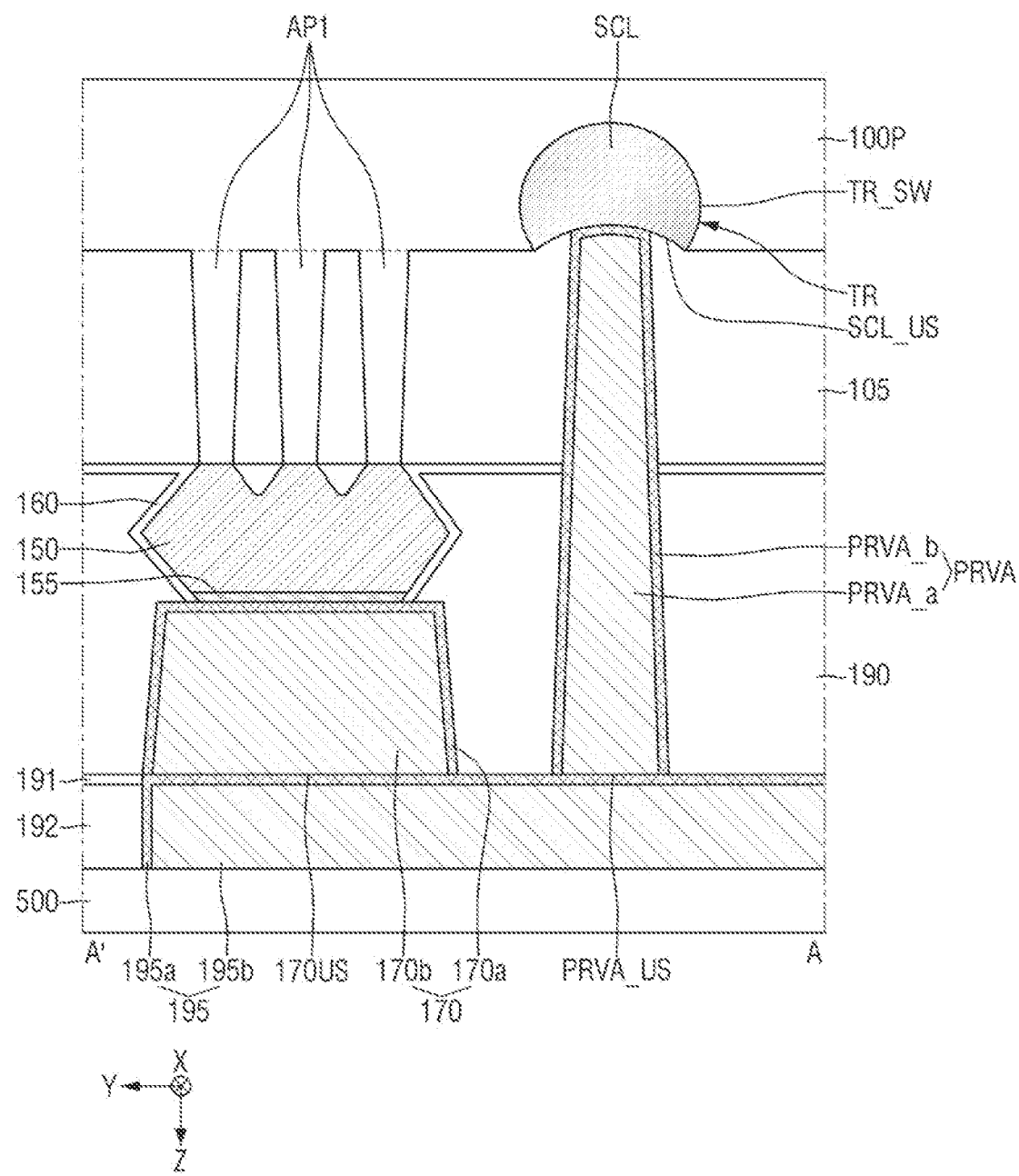

Referring to FIG. 23, a capping substrate 500 may be formed on the second interlayer insulating film 192 and the via plug 195. The capping substrate 500 may be embodied as a glass substrate or a silicon substrate. Then, the semiconductor device may be turned upside down.

Figure 24:
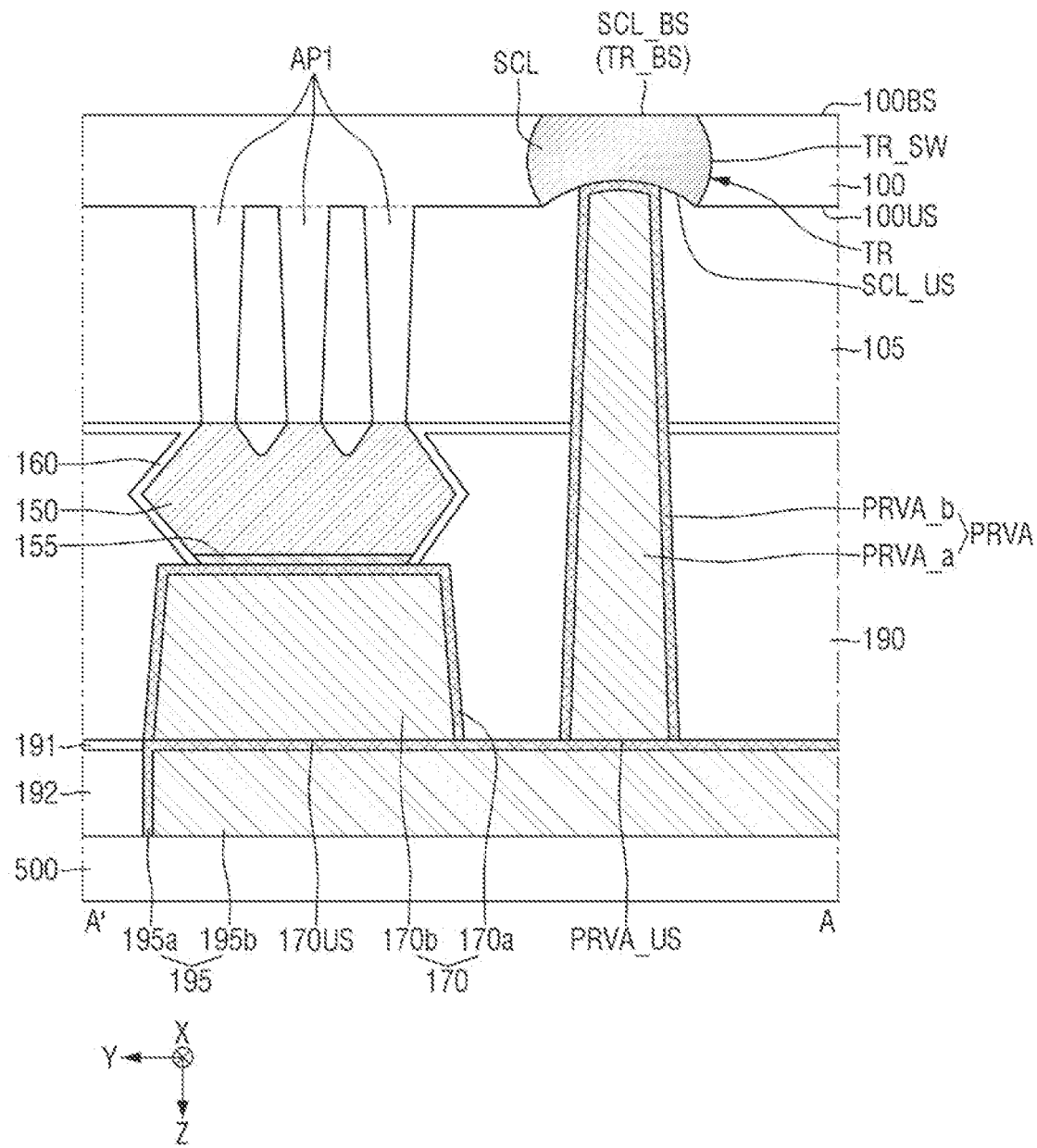

Referring to FIG. 24, the substrate 100 may be formed by etching the pre-substrate 100P. The substrate 100 may include the upper surface 100US and the lower surface 100BS which are opposite to each other.

The sacrificial film SCL may be exposed by etching the pre-substrate 100P. For example, the pre-substrate 100P may be etched via a planarization process (Chemical Mechanical Polishing (CMP)). When the sacrificial film SCL is exposed while performing the planarization process, the planarization process may be stopped. Accordingly, the lower surface 100BS of the substrate 100 may be substantially coplanar with the bottom surface SCL_BS of the sacrificial film SCL. The lower surface 100BS of the substrate 100 may be substantially coplanar with the bottom surface TR_BS of the trench TR.

Figure 25:
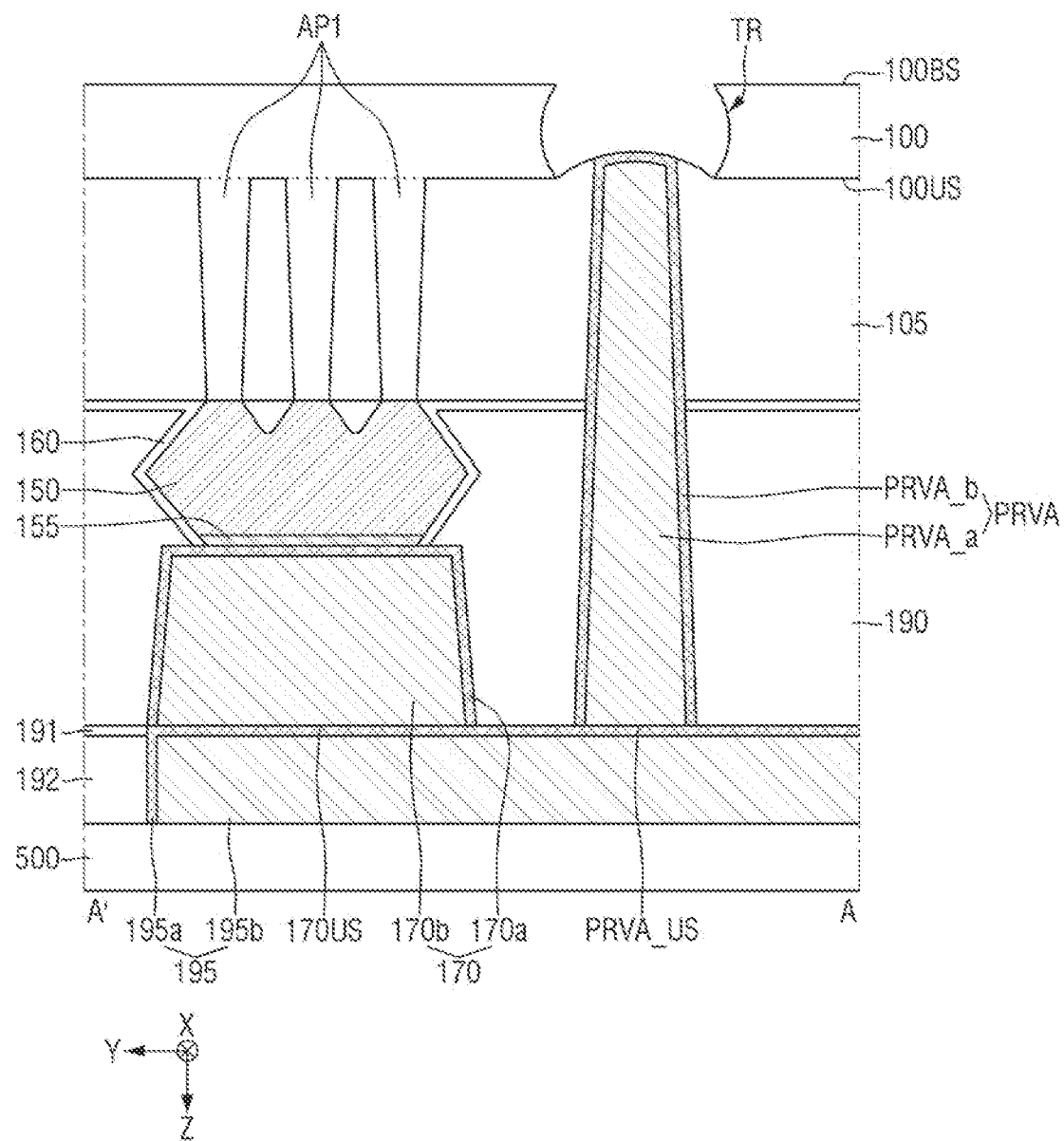

Referring to FIG. 25, the sacrificial film SCL may be removed. The power rail via PRVA and the field insulating film 105 may be exposed by removing the sacrificial film SCL. The sacrificial film SCL may have an etching selectivity with respect to the substrate 100. Therefore, the substrate 100 might not be removed while removing the sacrificial film SCL. The sacrificial film SCL may be selectively removed.

Figure 26:
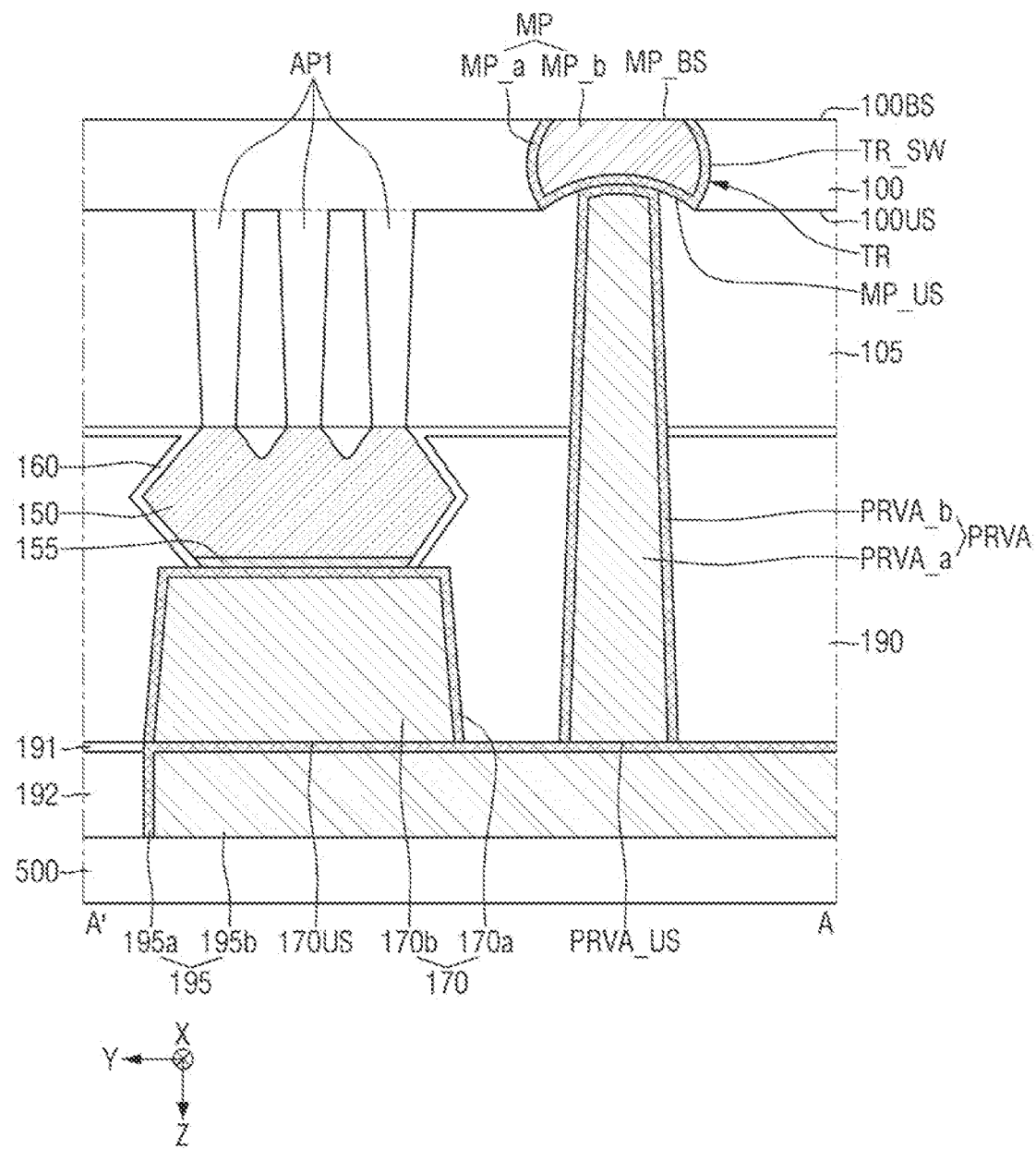

Referring to FIG. 26, the metal pattern MP may be formed in the trench TR. First, the metal pattern barrier film MP_a may be formed along the sidewall TR_SW of the trench TR. The metal pattern filling film MP_b may be formed on the metal pattern barrier film MP_a. Since the sidewall TR_SW of the trench TR has a convex shape, the sidewall MP_SW of the metal pattern MP may have a convex shape. The metal pattern MP and the power rail via PRVA may be electrically connected to each other.

Figure 27:
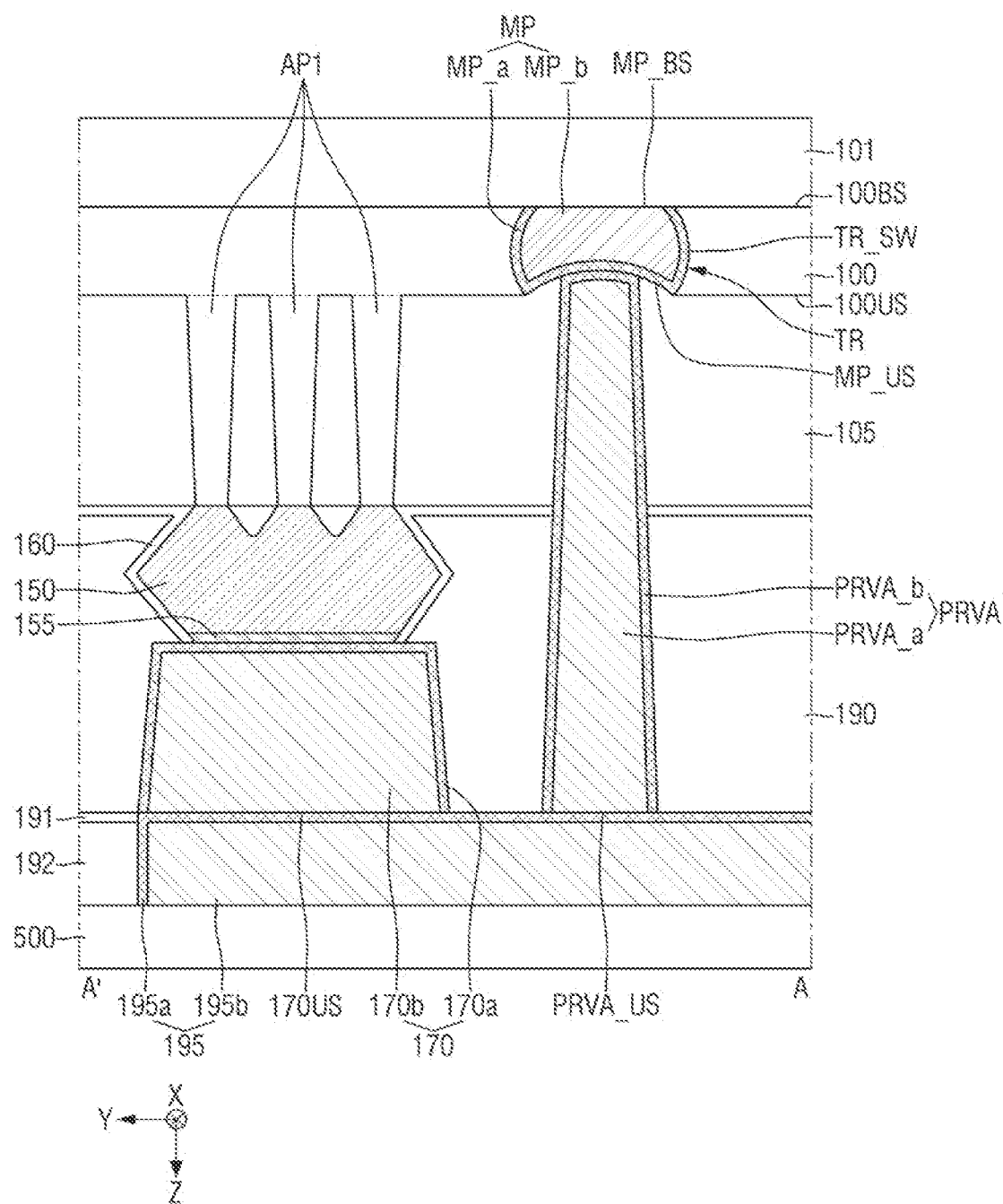

Referring to FIG. 27, the lower insulating film 101 may be formed on the lower surface 100BS of the substrate 100. The lower insulating film 101 may cover the lower surface 100BS of the substrate 100 and the metal pattern MP.

Figure 28:
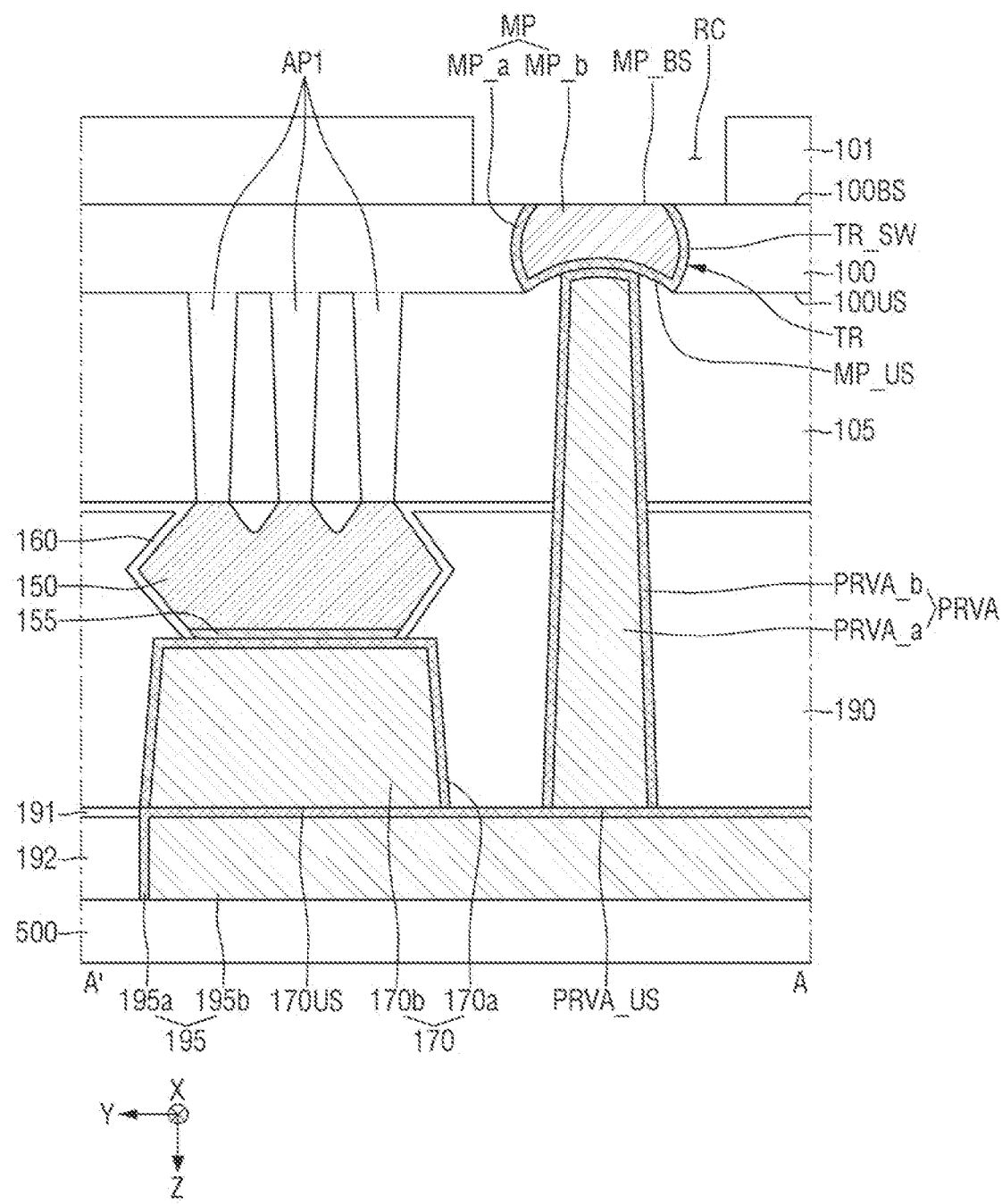

Referring to FIG. 28, a recess RC may be formed by etching a portion of the lower insulating film 101. The recess RC is formed on the metal pattern MP. The recess RC may expose the bottom surface MP_BS of the metal pattern MP.

Figure 29:
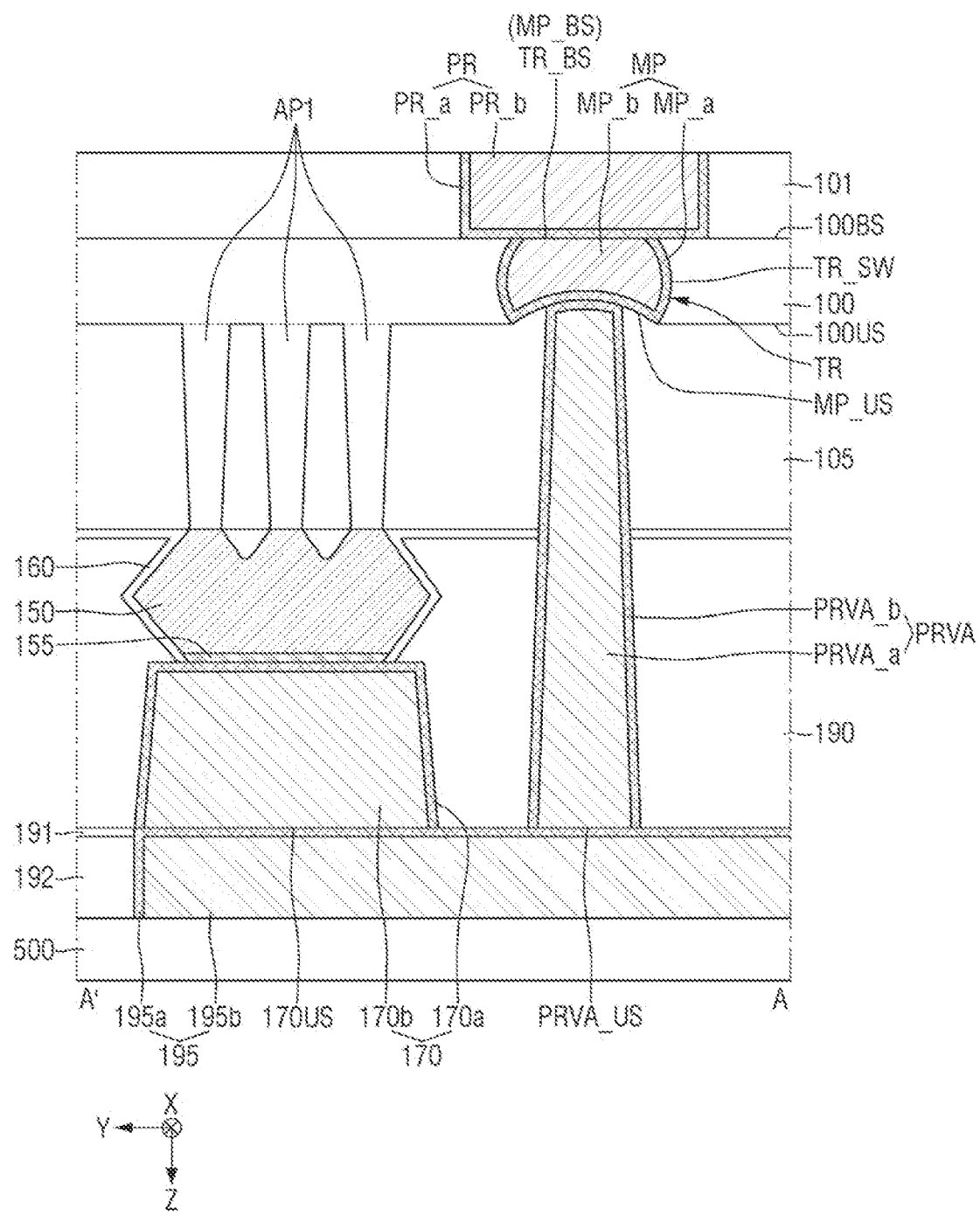

Referring to FIG. 29, the power rail PR filling the recess RC may be formed. The power rail PR may contact the metal pattern MP. The power rail PR may be connected to the metal pattern MP. The power rail PR may be connected to the power rail via PRVA. The power rail PR may be electrically connected to the power rail via PRVA via the metal pattern MP. Subsequently, the capping substrate 500 may be removed and the semiconductor device may be turned upside down.

While the present inventive concept has been described with reference to exemplary embodiments thereof, it will be understood by those of ordinary skill in the art that various changes in form and details may be made thereto without departing from the spirit and scope of the present inventive concept.

What is claimed is:
1. A semiconductor device comprising:
a substrate including an upper surface and a lower surface opposite to the upper surface;
an active pattern disposed on the upper surface of the substrate and extending in a first direction;

a field insulating film disposed on the upper surface of the substrate and covering a sidewall of the active pattern;
a power rail disposed on the lower surface of the substrate and extending in the first direction;
a trench formed in the substrate and exposing a portion of the power rail; and
a metal pattern filling at least a portion of the trench and connected to the power rail,
wherein a bottom surface of the trench is substantially coplanar with the lower surface of the substrate,
wherein a sidewall of the trench has a convex shape, and
wherein at least a portion of the field insulating film is disposed in the trench.

2. The semiconductor device of claim 1, wherein a width, in a second direction, of the trench gradually increases and then decreases as the trench extends in a direction from the lower surface of the substrate toward the upper surface of the substrate, and
wherein the second direction intersects the first direction.

3. The semiconductor device of claim 1, wherein a width, in the first direction, of the trench gradually increases and then decreases as the trench extends in a direction from the lower surface of the substrate toward the upper surface of the substrate.

4. The semiconductor device of claim 1, wherein an interface between the field insulating film and the metal pattern is convex toward the power rail.

5. The semiconductor device of claim 1, further comprising:
a power rail via disposed on the metal pattern and connected to the power rail via the metal pattern.

6. The semiconductor device of claim 5, wherein at least a portion of the power rail via overlaps the substrate in a second direction intersecting the first direction.

7. The semiconductor device of claim 5, further comprising:
a source/drain pattern disposed on the active pattern; and
a source/drain contact disposed on the source/drain pattern,
wherein a bottom surface of the source/drain contact contacts an upper surface of the power rail via.

8. The semiconductor device of claim 7, wherein an upper surface of the source/drain pattern is substantially coplanar with the upper surface of the power rail via.

9. The semiconductor device of claim 1, wherein a slope of a sidewall of the trench gradually decreases and then increases as the sidewall of the trench extends in a direction from the lower surface of the substrate toward the upper surface of the substrate.

10. The semiconductor device of claim 1, wherein the active pattern includes a lower pattern and a plurality of sheet patterns spaced apart from the lower pattern.

11. A semiconductor device comprising:
a substrate including an upper surface and a lower surface opposite to the upper surface;
an active pattern disposed on the upper surface of the substrate and extending in a first direction;
a gate electrode covering at least a portion of the active pattern and extending in a second direction interesting the first direction;
a power rail disposed on the lower surface of the substrate and extending in the first direction;
a metal pattern disposed in the substrate and connected to the power rail; and
a power rail via disposed on the metal pattern and disposed on one side of the gate electrode, wherein the power rail via is connected to the power rail via the metal pattern,
wherein a bottom surface of the metal pattern extends in a parallel to the lower surface of the substrate and is substantially coplanar with the lower surface of the substrate, and
wherein the metal pattern has a portion, wherein each of a width in the second direction of the portion of the metal pattern and a width in the first direction of the portion of the metal pattern gradually increases as the portion of the metal pattern extends in a direction from the lower surface of the substrate to the upper surface of the substrate.

12. The semiconductor device of claim 11, wherein a height from the lower surface of the substrate to a bottom surface of the power rail via is smaller than a thickness of the substrate.

13. The semiconductor device of claim 11, further comprising:
a source/drain pattern disposed on the active pattern and on one side of the gate electrode; and
a source/drain contact disposed on the source/drain pattern,
wherein the power rail via is connected to the source/drain contact.

14. The semiconductor device of claim 13, wherein an upper surface of the source/drain contact is substantially coplanar with an upper surface of the power rail via.

15. The semiconductor device of claim 13, wherein a bottom surface of the source/drain contact is in contact with an upper surface of the power rail via.

16. The semiconductor device of claim 11, wherein at least a portion of the power rail via is in direct contact with the power rail.

17. The semiconductor device of claim 11, wherein at least a portion of a sidewall of the power rail via directly contacts the substrate.

18. The semiconductor device of claim 11, wherein the active pattern includes a lower pattern and a plurality of sheet patterns spaced apart from the lower pattern.

19. A semiconductor device comprising:
a substrate including an upper surface and a lower surface opposite to the upper surface;
an active pattern disposed on the upper surface of the substrate and extending in a first direction;
a gate electrode covering at least a portion of the active pattern and extending in a second direction intersecting the first direction;
a field insulating film disposed on the upper surface of the substrate and covering a sidewall of the active pattern;
a power rail disposed on the lower surface of the substrate and extending in the first direction;
a trench formed in the substrate and exposing a portion of the power rail, wherein the trench has a convexly shaped sidewall;
a metal pattern filling at least a portion of the trench and connected to the power rail;
a source/drain pattern disposed on the active pattern and on one side of the gate electrode;
a source/drain contact disposed on the source/drain pattern; and
a power rail via disposed on the metal pattern and disposed on one side of the gate electrode, wherein the power rail via is connected to the power rail via the metal pattern, wherein a bottom surface of the trench is substantially coplanar with the lower surface of the substrate, wherein at least a portion of the field insulating film is disposed in the trench, and wherein each of a width in the first direction of the trench and a width in the second direction of the trench gradually increases and then decreases as the trench extends in a direction from the lower surface of the substrate to the upper surface of the substrate.

20. The semiconductor device of claim 19, wherein the active pattern includes a lower pattern and a plurality of sheet patterns spaced apart from the lower pattern.

* * * * *